(12) United States Patent
Hamada et al.

(10) Patent No.: US 6,599,785 B2
(45) Date of Patent: Jul. 29, 2003

(54) METHOD OF MANUFACTURING A SEMICONDUCTOR DEVICE

(75) Inventors: Takashi Hamada, Atsugi (JP); Yasuyuki Arai, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/078,414

(22) Filed: Feb. 21, 2002

(65) Prior Publication Data
US 2002/0119606 A1 Aug. 29, 2002

(30) Foreign Application Priority Data
Feb. 28, 2001 (JP) .......................... 2001-056049

(51) Int. Cl.[7] ............................................. H01L 21/00
(52) U.S. Cl. ....................... 438/151; 438/154; 438/163; 438/164
(58) Field of Search ................................. 438/149, 151, 438/154, 163, 164

(56) References Cited
U.S. PATENT DOCUMENTS

| | | | | |
|---|---|---|---|---|
| 5,563,427 A | * | 10/1996 | Yudasaka et al. | 257/72 |
| 5,953,582 A | * | 9/1999 | Yudasaka et al. | 438/29 |
| 6,096,585 A | * | 8/2000 | Fukuda et al. | 438/154 |
| 6,278,131 B1 | * | 8/2001 | Yamazaki et al. | 257/59 |
| 6,306,694 B1 | * | 10/2001 | Yamazaki et al. | 437/151 |

* cited by examiner

Primary Examiner—T. N. Quach
(74) Attorney, Agent, or Firm—Eric J. Robinson; Robinson Intellectual Property Law Office, P.C.

(57) ABSTRACT

TFT structures optimal for driving conditions of a pixel portion and driving circuits are obtained using a small number of photo masks. First through third semiconductor films are formed on a first insulating film. First shape first, second, and third electrodes are formed on the first through third semiconductor films. The first shape first, second, third electrodes are used as masks in first doping treatment to form first concentration impurity regions of one conductivity type in the first through third semiconductor films. Second shape first, second, and third electrodes are formed from the first shape first, second, and third electrodes. A second concentration impurity region of the one conductivity type which overlaps the second shape second electrode is formed in the second semiconductor film in second doping treatment. Also formed in the second doping treatment are third concentration impurity regions of the one conductivity type which are placed in the first and second semiconductor films. Fourth and Fifth concentration impurity regions having the other conductivity type that is opposite to the one conductivity type are formed in the third semiconductor film in third doping treatment.

17 Claims, 28 Drawing Sheets

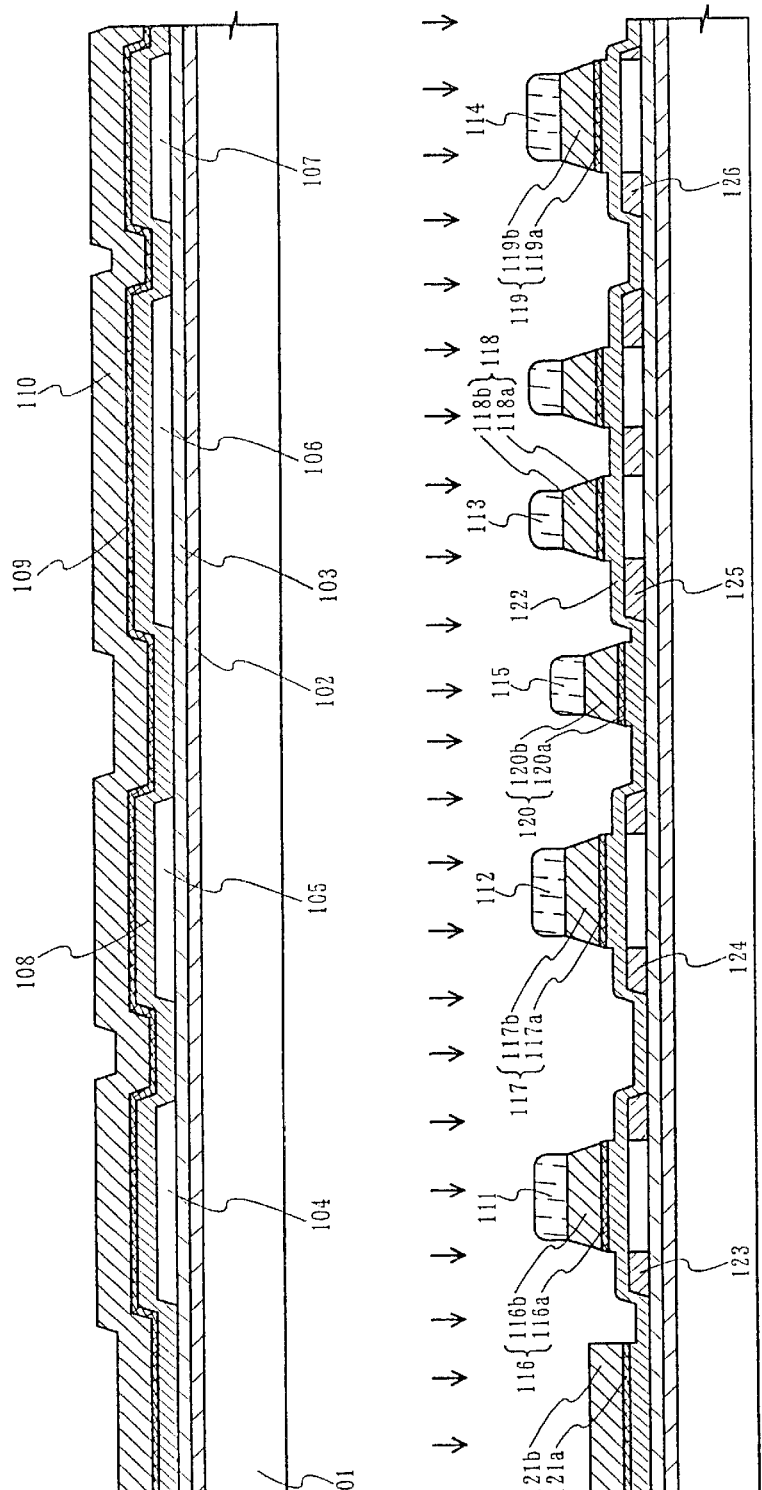

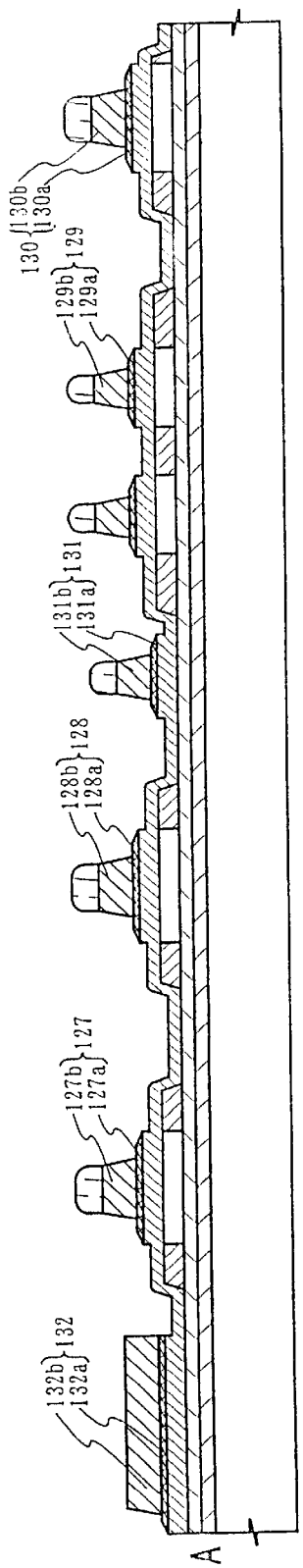
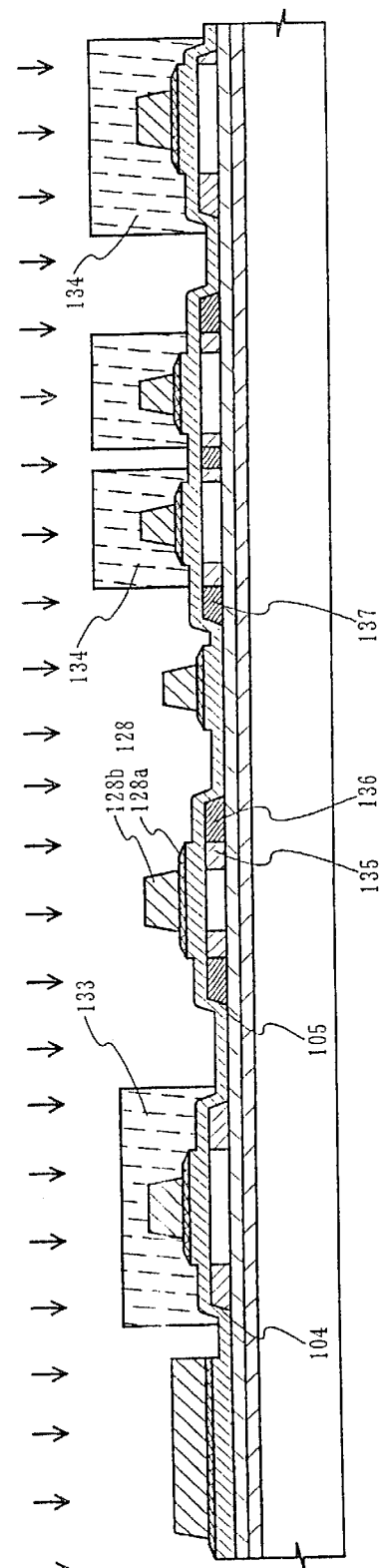

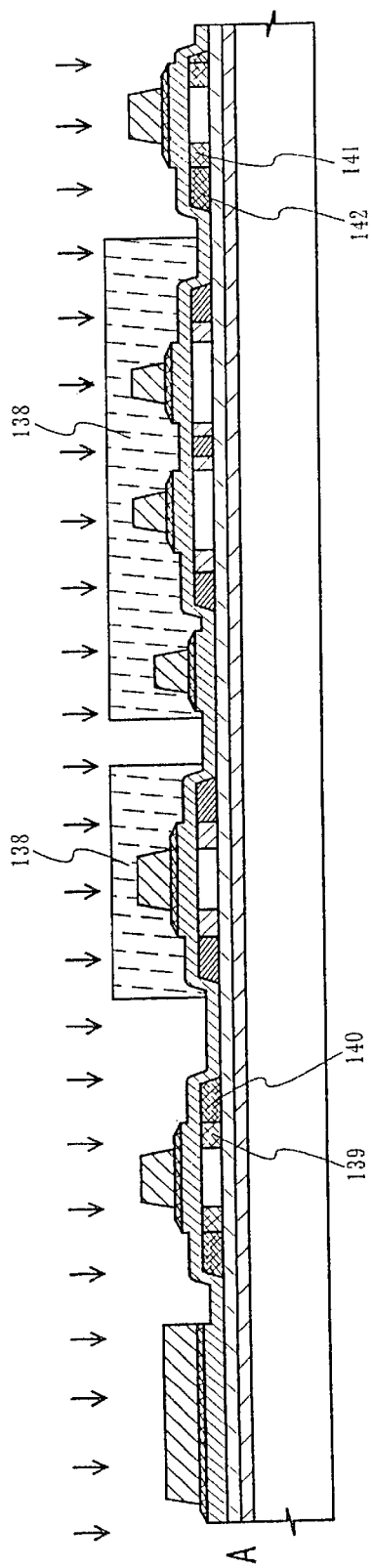
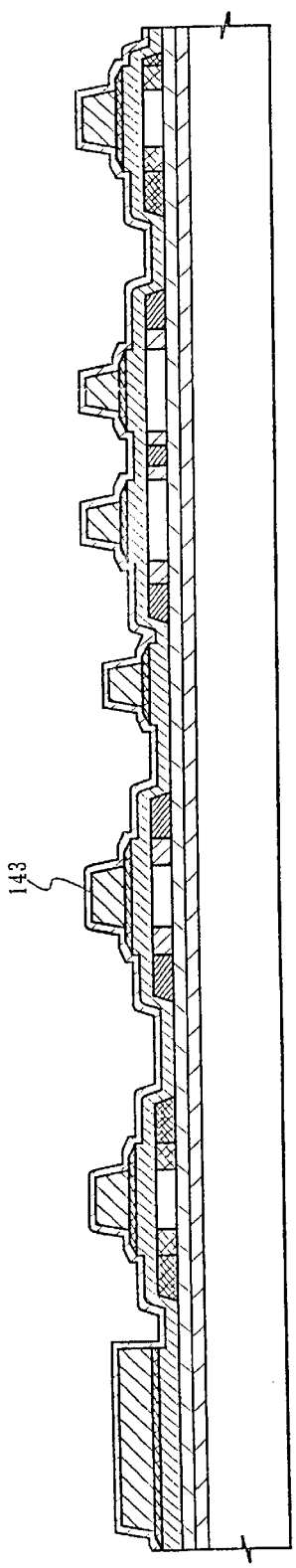

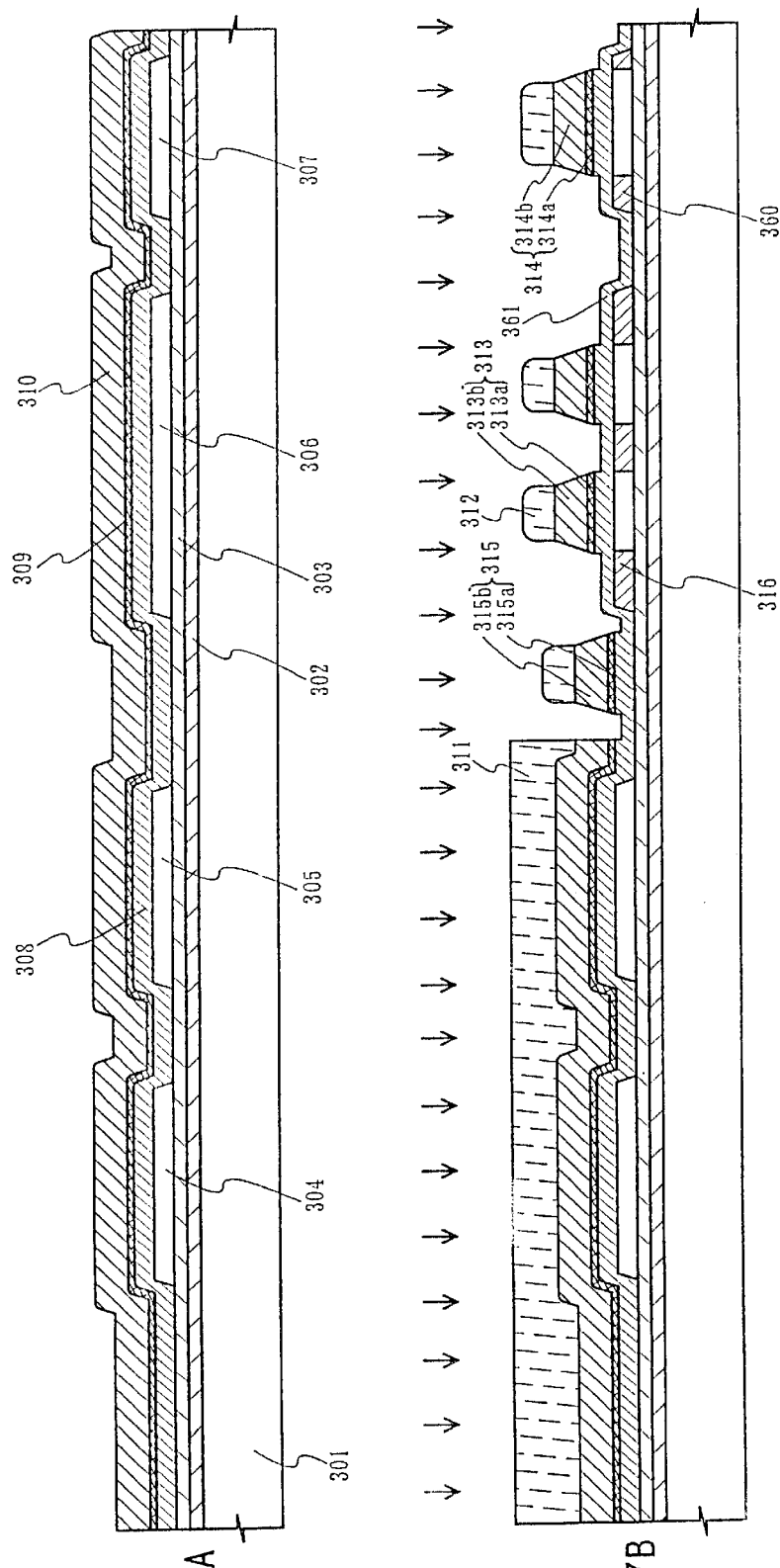

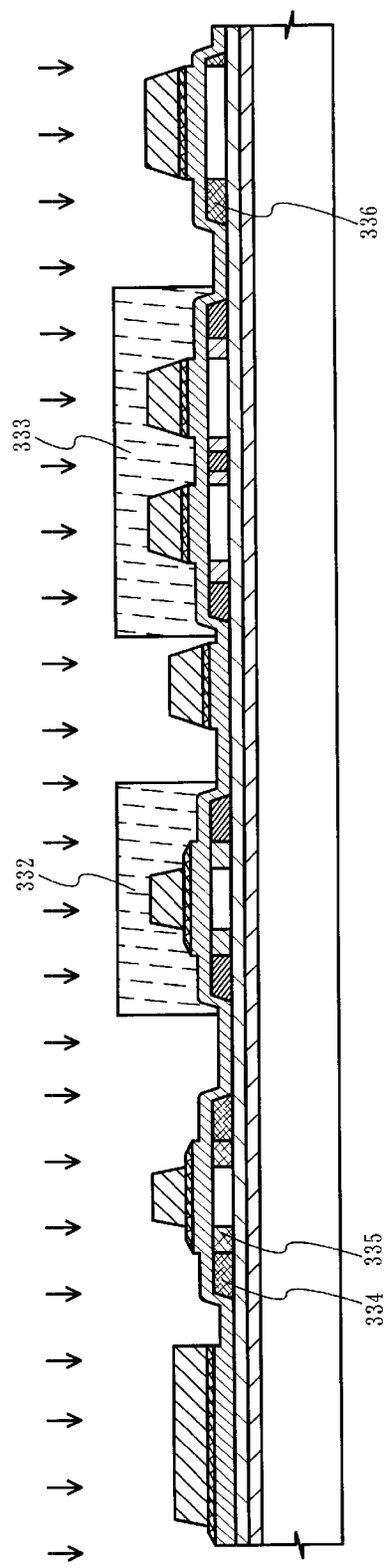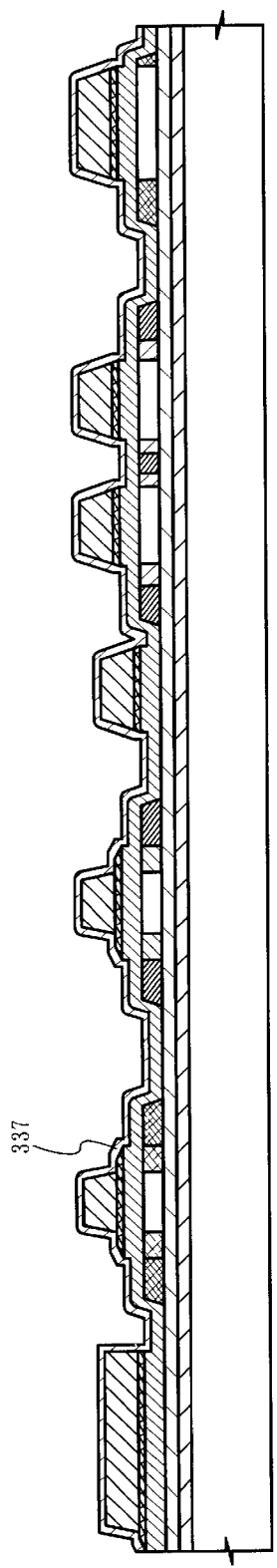

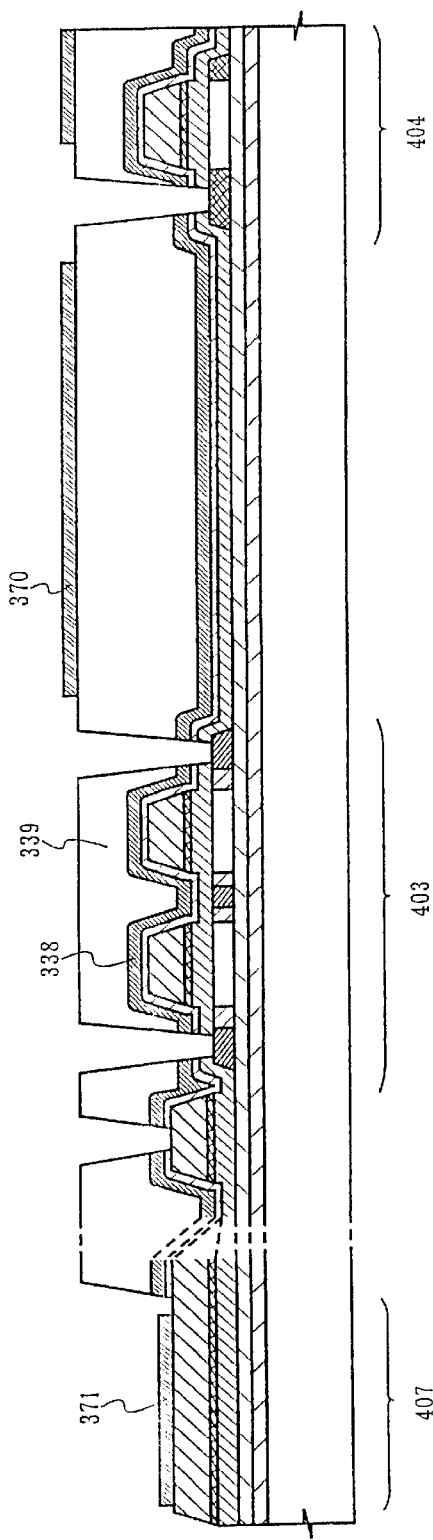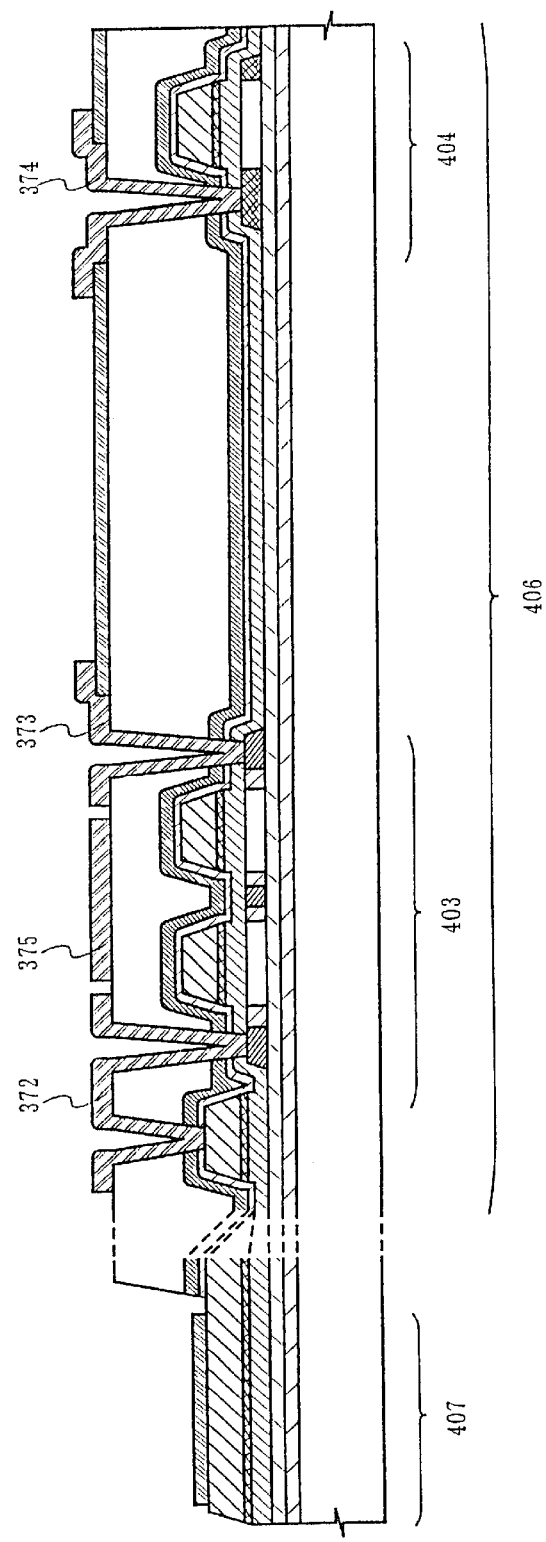
Fig. 11A
Fig. 11B

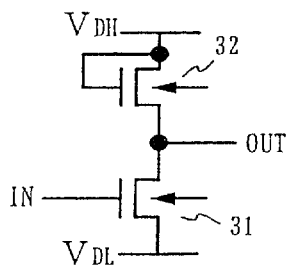 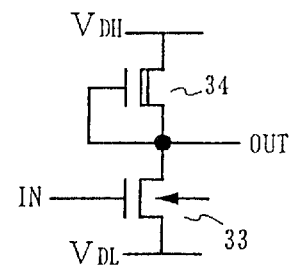
Fig. 19A    Fig. 19B
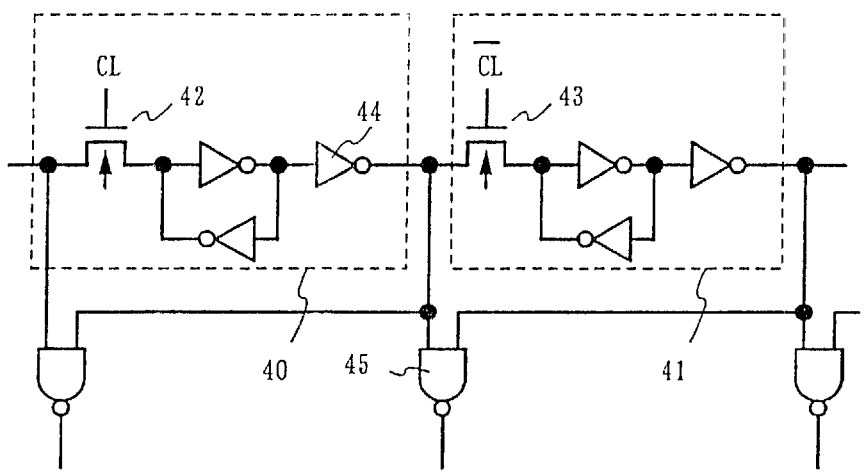
Fig. 20A
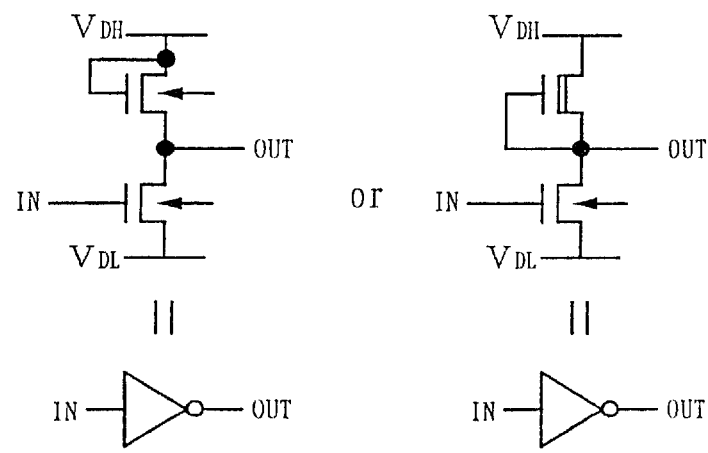
Fig. 20B

METHOD OF MANUFACTURING A SEMICONDUCTOR DEVICE

BACKGROUND OF THE INVENTION

1. Field of the Invention

The present invention relates to a semiconductor device with a thin film transistor (hereinafter referred to as TFT) formed of a semiconductor film that has a crystal structure and is formed on a substrate, and to a method of manufacturing the semiconductor device.

2. Description of the Related Arts

A display for displaying text and images is indispensable means for people to digest information with various semiconductor devices that have semiconductor elements, such as television sets, personal computers, and cellular phones. CRTs have long been in the market to acquire the position of representative display. On the other hand, liquid crystal displays and other flat displays (flat panel displays) are lately increasing their shares exponentially, for electronic devices are desired to reduce weight and size.

One mode of flat panel displays is active matrix driving in which a TFT is provided in each pixel or dot and data signals are sequentially written to display an image. A TFT is an indispensable element in active matrix driving.

Most TFTs are formed from amorphous silicon. Those TFTs cannot operate at high speed and therefore they are used only as switching elements provided in respective dots. Since the TFTs cannot make other elements than switching elements, external ICs (driver ICs) mounted by TAB (tape automated bonding) or COG (chip on glass) are used in data line side driving circuits for outputting video signals to data lines and in scanning line side driving circuits for outputting scanning signals to scanning lines.

However, mounting a driver IC is considered as a limited method because the pixel pitch is reduced as the pixel density is increased. For instance, at a pixel density of UXGA level (1200×1600 pixels) in the RGB color method, at least 6000 connection terminals are necessary even by a crude estimation. An increase in number of connection terminals leads to increased occurrence of contact failure. It also leads to an increase in area of the border surrounding the pixel portion (called a picture frame region), which hinders reduction in size of a semiconductor device that employs this display and spoils the external design of the semiconductor device. Against this background, apparently a display device in which driving circuits are integrated with a pixel portion is needed. By integrally forming a pixel portion and a scanning line side and data line side driving circuits on the same substrate, the number of connection terminals can be markedly reduced as well as the area of the picture frame region.

The integrated driving circuits are demanded to have high driving performance (ON current: $I_{on}$) and to improve their reliability by preventing degradation due to the hot carrier effect whereas low OFF current ($I_{off}$) is required for the pixel portion. A lightly doped drain (LDD) structure is known as a TFT structure capable of reducing the OFF current value. In the LDD structure, an LDD region, which is lightly doped with an impurity element, is placed between a channel formation region and a source region or drain region heavily doped with an impurity element. A structure that is known to be effective in preventing degradation of ON current value due to hot carriers is an LDD structure in which an LDD region partially overlaps a gate electrode (gate-drain overlapped LDD; hereinafter abbreviated as GOLD).

A TFT is manufactured by layering a semiconductor film and an insulating film or conductive film while using photo masks to etch the films into given shapes. If optimization of TFT structures to suit what are demanded for the pixel portion and the driving circuits is dealt with by simply increasing the number of photo masks, the manufacture process becomes complicated and the number of steps is increased inevitably.

SUMMARY OF THE INVENTION

The present invention has been made to solve those problems, and an object of the present invention is therefore to provide a technique of obtaining TFT structures optimal for driving conditions of a pixel portion and driving circuits using a small number of photo masks.

In order to attain the above object of the invention, the present invention adopts a gate electrode of two-layer structure in which a first layer in contact with a gate insulating film is longer in channel length direction than a second layer. The two-layer structure gate electrode is used in forming source and drain regions and an LDD region in a self-aligning manner in an n-channel TFT of a driving circuit portion. Source and drain regions and an LDD region of an n-channel TFT in a pixel portion are formed not in a self-aligning manner but by using a photo mask. The LDD region of the n-channel TFT in the driving circuit portion is positioned so as to overlap the gate electrode whereas the LDD region of the n-channel TFT in the pixel portion is placed outside of the gate electrode (so as not to overlap the gate electrode). The source and drain regions and the two types of LDD regions, which have different positional relation with respect to the gate electrodes, are formed through two doping treatment steps.

As described above, a method of manufacturing a semiconductor device in accordance with the present invention is characterized by comprising the steps of:

forming on a first insulating film first through third semiconductor films that are separated from one another;

forming a first electrode, a second electrode, and a third electrode respectively on the first semiconductor film, the second semiconductor film, and the third semiconductor film with a second insulating film interposed between the electrodes and the films, the electrodes having a first shape;

using as masks the first shape first through third electrodes in first doping treatment to form first concentration impurity regions of one conductivity type in the first through third semiconductor films;

forming second shape first through third electrodes from the first shape first through third electrodes;

forming through second doping treatment a second concentration impurity region of the one conductivity type in the second semiconductor film, and third concentration impurity regions of the one conductivity type in the first semiconductor film and the second semiconductor film, the second concentration impurity region overlapping the second shape second electrode; and forming through third doping treatment a fourth concentration impurity region and a fifth concentration impurity region in the third semiconductor film, the regions having the other conductivity type that is opposite to the one conductivity type. In other words, the semiconductor device manufacturing method of the present invention is characterized in that etching treatment for forming a gate electrode of a TFT is combined with doping treatment to form LDD regions and a source or drain region in a self-aligning manner.

Further, according to another structure of the present invention, the method is characterized by comprising the steps of: forming on a first insulating film a first semiconductor film, a second semiconductor film, and a third semiconductor film that are separated from one another; forming a first shape first electrode above the first semiconductor film with a second insulating film interposed therebetween; using the first shape first electrode as a mask to form a first concentration impurity region of one conductivity type in the first semiconductor film; forming a first shape second electrode and third electrode above the second semiconductor film and the third semiconductor film with the second insulating film interposed between the semiconductor films and electrodes; etching the first shape second electrode and third electrode to form a second shape second electrode and third electrode; forming through second doping treatment a second concentration impurity region of the one conductivity type in the second semiconductor film, and third concentration impurity regions of the one conductivity type in the first semiconductor film and the second semiconductor film, the second concentration impurity region overlapping the second shape second electrode; and forming through third doping treatment a fourth concentration impurity region and a fifth concentration impurity region in the third semiconductor film, the regions having the other conductivity type that is opposite to the one conductivity type.

With the manufacture method as this, LDD that overlaps a gate electrode is formed in a self-aligning manner in an n-channel TFT of a driving circuit. This LDD is obtained at the same time a source or drain region is formed through the same doping step by utilizing the film thickness difference (level difference) of the gate electrode. On the other hand, a mask is used to form LDD that does not overlap a gate electrode in an n-channel TFT of a pixel portion.

The term semiconductor device in the present invention refers to devices in general that utilize semiconductor characteristics to function, and display devices, representatively, liquid crystal display devices having TFTs, and semiconductor integrated circuits (micro processors, signal processing circuits, high frequency circuits, and the like) are included therein.

BRIEF DESCRIPTION OF THE DRAWINGS

In the accompanying drawings:

FIGS. 1A and 1B are sectional views illustrating a process of manufacturing a TFT according to the present invention;

FIGS. 2A and 2B are sectional views illustrating a process of manufacturing a TFT according to the present invention;

FIGS. 3A and 3B are sectional views illustrating a process of manufacturing a TFT according to the present invention;

FIGS. 7A and 7B are sectional views illustrating a process of manufacturing a TFT according to the present invention;

FIGS. 9A and 9B are sectional views illustrating a process of manufacturing a TFT according to the present invention;

FIGS. 11A and 11B are sectional views illustrating a method of manufacturing a transmissive display device;

FIGS. 19A and 19B are diagrams showing structures of NMOS circuits;

FIGS. 20A and 20B are diagrams showing the structure of a shift register;

DETAILED DESCRIPTION OF THE PREFERRED EMBODIMENTS

Embodiment Mode 1

Figure 4:
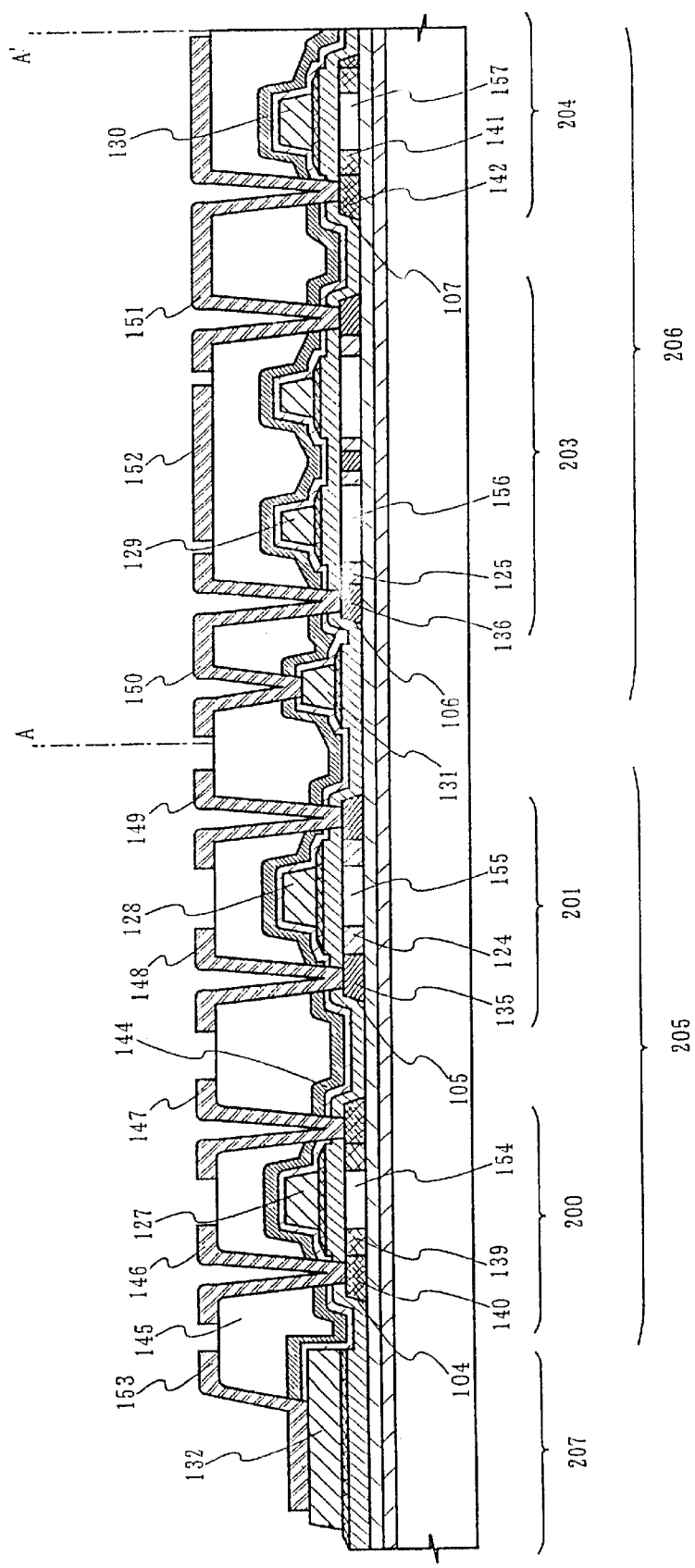
FIG. 4 is a sectional view illustrating a process of manufacturing a TFT according to the present invention.

An embodiment mode of the present invention will be described with reference to FIGS. 1A to 6. Here, a detailed description is given on a method of simultaneously forming on the same substrate a TFT for a pixel portion and TFTs (an n-channel TFT and a p-channel TFT for driving circuits that are placed near the pixel portion.

In FIG. 1A, a substrate 101 is a glass substrate, a quartz substrate, or a ceramic substrate. A silicon substrate, metal substrate or stainless steel substrate, with an insulating film formed on its surface may be used instead. A plastic substrate may also be used if it has a heat resistance that can withstand the process temperature of this embodiment mode.

First insulating films 102 and 103 are formed on the substrate 101. The first insulating films shown here have a two-layer structure but they may of course have a single layer structure. Semiconductor films 104 to 107 are semiconductors having a crystal structure. The semiconductor films are obtained by crystallizing amorphous semiconductor films that are formed on the first insulating films. After deposition, the amorphous semiconductor films are crystallized by heat treatment or laser light irradiation. The material of the amorphous semiconductor films is not limited but silicon or a silicon germanium ($Si_xGe_{1-x}$; $0<x<1$, typically $x=0.001$ to $0.05$) alloy is preferably used.

When the amorphous semiconductor films are crystallized by laser light irradiation, a pulse oscillation type or continuous-wave gas laser or solid laser is employed. Examples of gas lasers used include a KrF excimer laser, an ArF excimer laser, and a XeCl excimer laser. In a laser emitter employed, crystals of YAG, $YVO_4$, YLF, $YAlO_3$ or the like are doped with Cr, Nd, Er, Ho, Ce, Co, Ti, or Tm. Although varying between materials used for doping, the fundamental wave of laser light emitted from the laser emitter has a wavelength of 1 μm to 2 μm. In order to crystallize the amorphous semiconductor films, laser light has to be selectively absorbed by the semiconductor films. Therefore, it is preferable to choose laser light having a wavelength between visible ray and ultraviolet ray and to use second harmonic to fourth harmonic of the fundamental wave. Typically, the amorphous semiconductor films are crystallized using second harmonic (532 nm) by a $Nd:YVO_4$ laser emitter (fundamental wave: 1064 nm). Other than that, gas laser emitter such as an argon laser emitter and a krypton laser emitter can be used.

Before crystallization, the amorphous semiconductor films may be doped with nickel or other metal elements that have a catalytic effect on crystallization of semiconductors. For instance, a solution containing nickel is held to the surface of an amorphous silicon film, and the film is dehydrated (at 500° C. for an hour) and subsequently subjected to thermal crystallization (at 550° C. for four hours). Then, the film is irradiated with second harmonic of continuous-wave laser light selected from a YAG laser, a $YVO_4$ laser, and a YLF laser to improve the crystallinity.

Next, a second insulating film 108 is formed to cover the semiconductor films 104 to 107. The second insulating film 108 is an insulating film containing silicon and formed by plasma CVD or sputtering. The thickness thereof is set to 40 to 150 nm. The second insulating film formed to cover the semiconductor films 104 to 107 is used as a gate insulating film of the TFTs manufactured in this embodiment mode.

A conductive film for forming a gate electrode and a wiring line is formed on the second insulating film 108. A gate electrode in the present invention is formed from a laminate of two or more layers of conductive films. A first conductive film 109 is formed on the second insulating film 108 from a nitride of a high melting point metal such as molybdenum or tungsten. A second conductive film 110 is formed on the first conductive film from a high melting point metal, or from a low resistive metal such as aluminum and copper, or from polysilicon. Specifically, a nitride of one or more kinds of elements selected from the group consisting of W, Mo, Ta, and Ti is used for the first conductive film whereas the second conductive film uses an alloy of one or more kinds of elements selected from the group consisting of W, Mo, Ta, Ti, Al, and Cu, or n type polycrystalline silicon.

As shown in FIG. 1B, resist masks 111 to 114 are formed next to perform first etching treatment on the first conductive film and the second conductive film. Formed through this etching treatment are first shape electrodes 116 to 118 that are tapered around the edges and first shape wiring lines 114 and 115. The electrodes are tapered at an angle of 45 to 75°. Regions of the second insulating film 122 that are not covered with the first shape electrodes 116 to 118 and the first shape wiring lines 114 and 115 are etched and thinned by 20 to 50 nm.

First doping treatment employs ion implantation, or ion doping in which ions are injected without mass separation. In the doping, the first shape electrodes 116 to 118 are used as masks to form first concentration impurity regions 123 to 126 of one conductivity type in the semiconductor films 104 to 107. The first concentration is equal to $1 \times 10^{17}$ to $1 \times 10^{19}$ atoms/cm$^3$.

Without removing the resist masks 111 to 114, second etching treatment is conducted as shown in FIG. 2A. In this etching treatment, the second conductive film is subjected to anisotropic etching to form second shape electrodes 127 to 129 and second shape wiring lines 130 and 131. Regions of the second insulating film that are not covered with the second shape electrodes 127 to 129 and the second shape wiring lines 130 and 131 are etched and thinned by 20 to 50 nm.

Thereafter, a mask 133 for covering the entirety of the semiconductor film 104, a mask 134 for covering the second shape electrode 129 that is placed on the semiconductor film 106, and a mask 134 for covering the semiconductor film 107 are formed to conduct second doping treatment. Through the second doping treatment, a second concentration impurity region of the one conductivity type is formed in the semiconductor film 105 and third concentration impurity regions of the one conductivity type are formed in the semiconductor films 105 and 106.

A second concentration impurity region 135 of the one conductivity type is formed in a self-aligning manner at a position overlapping a first conductive film 128a that constitutes the second shape electrode 128. The impurity given by ion doping transmits through the first conductive film 128a before the semiconductor film is doped.

Therefore, the number of ions reaching the semiconductor film is reduced to make the concentration in the region 135 lower than in the third concentration n type impurity regions. The impurity concentration in the region 135 is $1 \times 10^{16}$ to $1 \times 10^{17}$ atoms/cm$^3$. Third concentration impurity regions 136 and 137 are doped with an n type impurity in a concentration of $1 \times 10_{20}$ to $1 \times 10^{21}$ atoms/cm$^3$.

Next, a resist mask 138 is formed as shown in FIG. 3A to conduct third doping treatment. Formed through the third doping treatment in the semiconductor film 104 are a fourth concentration impurity region 139 of the other conductivity type (a conductivity type opposite to the one conductivity type) and a fifth concentration impurity region 140 of the other conductivity type. The fourth concentration impurity region of the other conductivity type is formed in a region that overlaps the second shape electrode 127, and is doped with the impurity element in a concentration of $1 \times 10^{18}$ to $1 \times 10^{19}$ atoms/cm$^3$. This impurity concentration allows the region to function as LDD. The fifth concentration impurity region 140 is doped with the impurity element in a concentration of $2 \times 10^{20}$ to $3 \times 10^{21}$ atoms/cm$^3$.

Through the above steps, regions doped with impurities are formed in the respective semiconductor films for the purpose of controlling valence electrons. The second shape electrodes 127 to 129 serve as gate electrodes. The second shape wiring line 130 serves as one of electrodes that constitute a storage capacitor in the pixel portion. The second shape wiring line 131 forms a data line in the pixel portion.

A third insulating film 143 is formed next by plasma CVD or sputtering. The third insulating film 143 is a silicon oxynitride film, a silicon oxide film, or the like.

Thereafter, the impurity elements doped into the semiconductor films are activated as shown in FIG. 3B. This activation step is carried out using a furnace annealing or a rapid thermal annealing (RTA). The heat treatment is conducted in a nitrogen atmosphere at a temperature of 400 to 700° C., typically, 450 to 500° C. Instead, laser annealing using second harmonic (532 nm) of YAG laser may be employed. The semiconductor films are irradiated with the second harmonic (532 nm) of YAG laser to activate the impurity elements. The activation method is not limited to laser light irradiation and RTA using a lamp light source may be employed to heat the semiconductor films by subjecting one or both sides of the substrate to lamp light source radiation.

As shown in FIG. 4, a fourth insulating film 144 made of silicon nitride is then formed by plasma CVD to have a thickness of 50 to 100 nm. Heat treatment at 410° C. is conducted in a clean oven to hydrogenate the semiconductor films with hydrogen released from the silicon nitride film.

A fifth insulating film 145 made of an organic insulating material is formed next on the fourth insulating film 144. An organic insulating material is used in order to level the outermost surface of the fifth insulating film. Then, contact holes piercing through the third to fifth insulating films are formed by etching treatment. In this etching treatment, regions of the third to fifth insulating films that are placed in an external input terminal portion are removed. A titanium film and an aluminum film are layered to form wiring lines 146 to 149, a pixel electrode 151, a scanning line 152, a connection electrode 150, and a wiring line 153 that is connected to the external input terminal.

If the one conductivity type is n type and the other conductivity type (opposite to the one conductivity type) is p type, a driving circuit 205 that has a p-channel TFT 200 and a first n-channel TFT 201 and a pixel portion 206 that has a second n-channel TFT 203 and a capacitor portion 204 are formed on the same substrate through the above steps. The capacitor portion 204 is composed of the semiconductor film 107, a part of the second insulating film 122, and the first shape capacitance wiring line 130.

The p-channel TFT 200 of the driving circuit 205 has a channel formation region 154, the fifth concentration p type impurity region 140 placed outside of the second electrode 127 that serves as a gate electrode (the region 140 functions as a source region or a drain region), and the fourth concentration p type impurity region (LDD) that overlaps the second electrode 127.

The first n-channel TFT 201 has a channel formation region 155, the second concentration n type impurity region 124 (LDD) overlapping the second shape electrode 128 that serves as a gate electrode, and the third concentration n type impurity region 135 that functions as a source region or a drain region. The length of the LDD in the channel length direction is 0.5 to 2.5 μm, preferably 1.5 μm. This LDD structure is for preventing TFT degradation caused mainly by hot carrier effect. The n-channel TFT and the p-channel TFT can be used to form a shift register circuit, a buffer circuit, a level shifter circuit, a latch circuit, etc. The structure of the first n-channel TFT 201 is suitable especially for a buffer circuit that is high in driving voltage because the structure can prevent degradation by hot carrier effect.

The second n-channel TFT 203 of the pixel portion 206 has a channel formation region 156, the first concentration n type impurity region 125 formed outside of the second shape electrode 129 that serves as a gate electrode, and the third concentration n type impurity region 136 that functions as a source region or a drain region. P type impurity regions 141 and 142 are formed in the semiconductor film 107 that functions as one of electrodes of the capacitor portion 204.

The pixel portion 206 has the pixel electrode 151 and the connection electrode 150 that connects the data line 131 to the third concentration n type impurity region 136 of the semiconductor film 106. The pixel portion also has the gate wiring line 152, which, though not shown in the drawing, is connected to the second shape electrode 129 that functions as a gate electrode.

As described above, the present invention makes it possible to form on the same substrate a first n-channel TFT, which has a one conductivity type impurity region with LDD that overlaps a gate electrode, and a second n-channel TFT in which LDD does not overlap a gate electrode. The two types of TFTs are separately arranged in circuits of different operation conditions, for example, one TFT in a driving circuit portion and the other TFT in a pixel portion. In the p-channel TF; LDD overlaps a gate electrode.

The substrate formed in this embodiment mode, which has the driving circuit portion 205 and the pixel portion 206, is referred to as active matrix substrate for conveniences' sake. This active matrix substrate can be used to manufacture a display device of active matrix driving. The active matrix substrate in this embodiment mode has its pixel electrode formed from a light reflective material, and therefore can make a reflective liquid crystal display device. A liquid crystal display device as well as a light emitting device in which an organic light emitting device is used for a pixel portion can be manufactured from the active matrix substrate.

Embodiment Mode 2

Another embodiment mode of the present invention will be described with reference to FIGS. 7A to 10. Here, a detailed description is given on a method of simultaneously forming on the same substrate a TFT for a pixel portion and TFTs (an n-channel TFT and a p-channel TFT) for driving circuits that are placed in the periphery of the pixel portion.

The description on the substrate, the insulating films, the semiconductor films, and the conductive films in Embodiment Mode 1 applies to a substrate 301, first insulating films 302 and 303, semiconductor films 304 to 307, a second insulating film 308, a first conductive film 309, and a second conductive film 310 in FIG. 7A.

Masks 311 and 312 are formed in FIG. 7B. The mask 311 covers the driving circuit portion whereas the mask 312 covers the pixel portion. With the masks covering the pixel and driving circuit portions, the first conductive film and the second conductive film are etched in first etching treatment to form a first shape electrode 313 and first shape wiring lines 314 and 315 (the electrode is composed of a first conductive film 313a and a second conductive film 313b, the wiring line 314 of a first conductive film 314a and a second conductive film 314b, the wiring line 315 of a first conductive film 315a and a second conductive film 315b). Next, the semiconductor films 306 and 307 are doped with an impurity element of one conductivity type in first doping treatment to form first concentration impurity regions 316 and 360 of the one conductivity type.

Figure 8A:
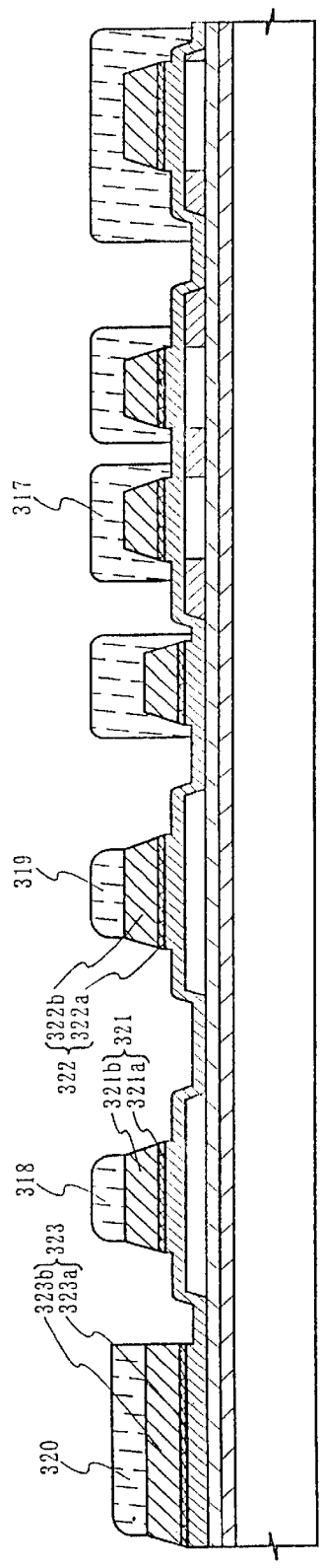
FIGS. 8A and 8B are sectional views illustrating a process of manufacturing a TFT according to the present invention.

The masks 311 and 312 are removed and then a mask 317 that covers the first shape electrode 313 and the first shape wiring lines 314 and 315 is formed as shown in FIG. 8A. Further, masks 318 to 320 are formed on the driving circuit portion to form first shape electrodes 321 to 323 in the driving circuit portion through second etching treatment.

The first etching treatment and the second etching treatment are both for etching the first conductive film and the second conductive film to form tapered portions around the edges at an angle of 45 to 75°.

Figure 8B:
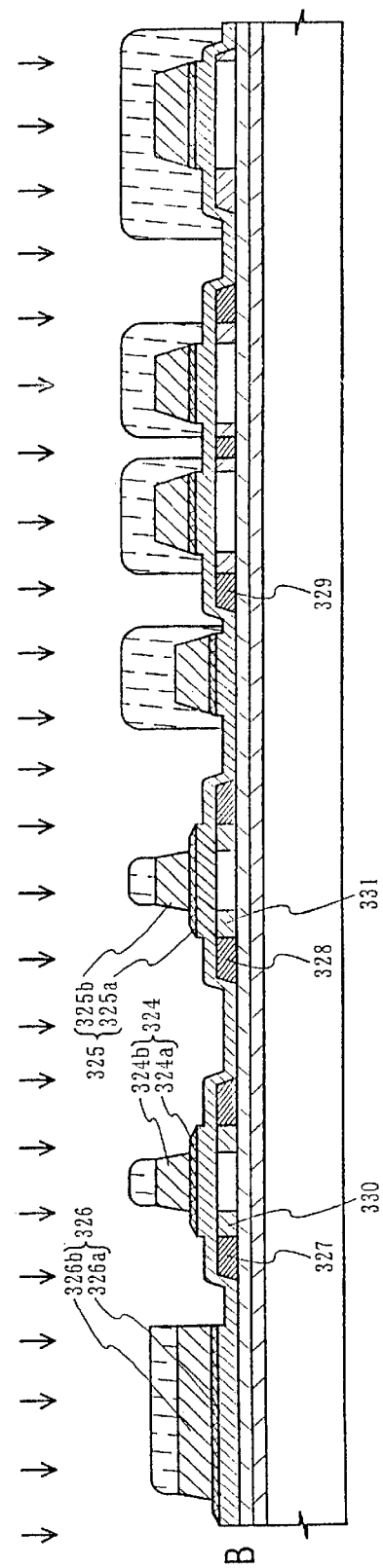

The second etching treatment is followed by third etching treatment as shown in FIG. 8B. The third etching treatment is for selectively etching the second conductive film to form second shape electrodes 324 to 326. The second shape electrodes have projections of first conductive films 324a to 326a.

The second shape electrodes 324 and 325 are used as masks in second doping treatment, utilizing the film thickness difference between the first conductive films 324a and 325a and the second conductive films 324b and 325b. As a result, impurity regions of the one conductivity type are formed in the semiconductor films 304 and 305. Second concentration impurity regions 330 and 331 of the one conductivity type are positioned so as to overlap the second shape electrodes whereas third concentration impurity regions 327 and 328 of the one conductivity type are formed in regions outside the second shape electrodes. A third concentration impurity region 329 of the one conductivity type is formed in the semiconductor film 306.

Thereafter, masks 332 and 333 are formed as shown in FIG. 9A to dope the semiconductor film 304 with an impurity of the other conductivity type through third doping treatment. The resultant impurity regions are a fourth concentration impurity region 335 of the other conductivity type and a fifth concentration impurity region 334 of the other conductivity type. A fifth concentration impurity region 336 of the other conductivity type is formed in the semiconductor film 307.

Subsequently, a third insulating film 337 is formed and the impurities used to dope the semiconductor films are activated similar to Embodiment Mode 1.

Figure 10:
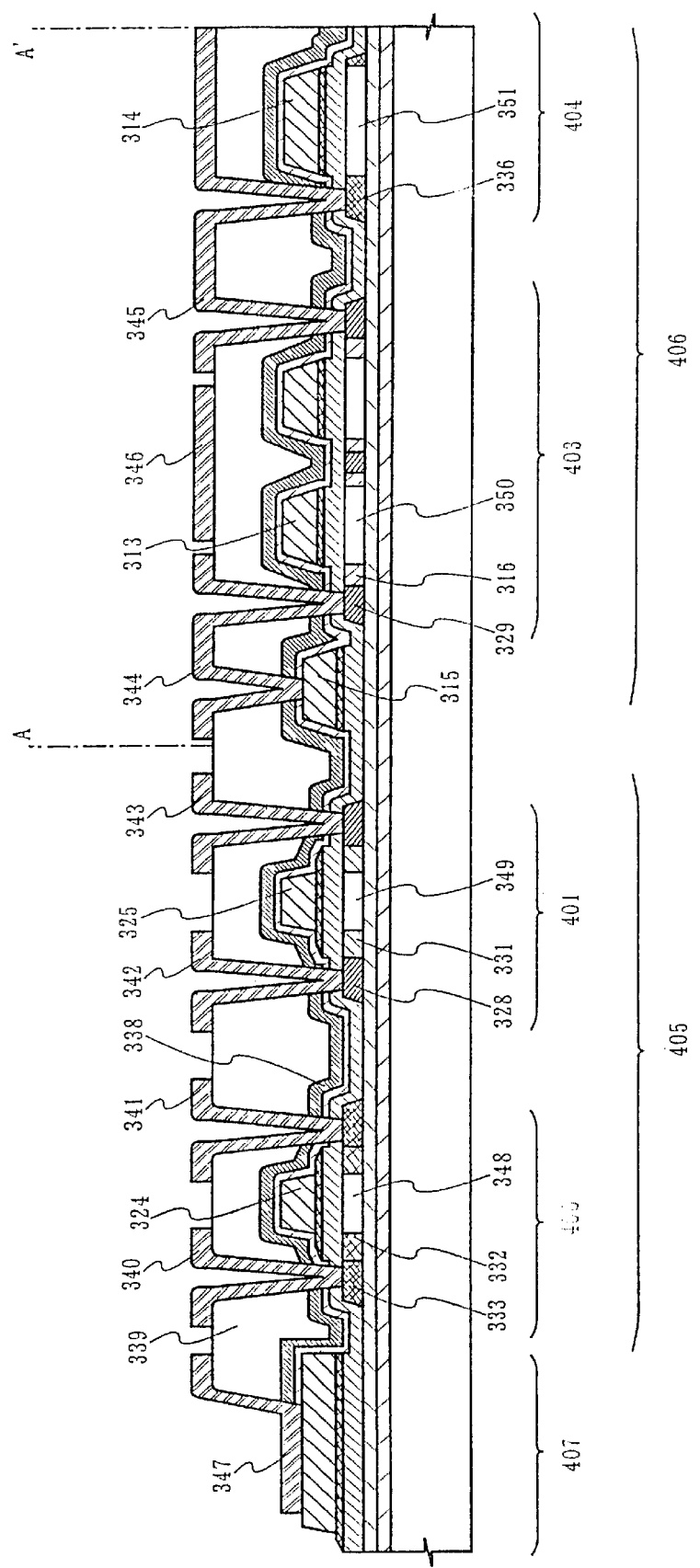
FIG. 10 is a sectional view illustrating a process of manufacturing a TFT according to the present invention.

A fourth insulating film 338 is, then formed as shown in FIG. 10 and is subjected to heat treatment at 410° C. to hydrogenate the semiconductor films. A fifth insulating film 339 is formed next on the fourth insulating film 338 from an organic insulating material. An organic insulating material is used in order to level the outermost surface of the fifth insulating film. Then, contact holes piercing through the third to fifth insulating films are formed by etching treatment. Wiring lines 340 to 343, a pixel electrode 345, a gate line 346, and wiring lines 344 and 347 are formed.

If the one conductivity type is n type and the other conductivity type (opposite to the one conductivity type) is p type, a driving circuit 405 that has a p-channel TFT 400 and a first n-channel TFT 401 and a pixel portion 406 that has a second n-channel TFT 403 and a capacitor portion 404 are formed on the same substrate through the above steps. The capacitor portion 404 is composed of the semiconductor film 307, a part of a second insulating film 361, and the first shape capacitance wiring line 314.

The p-channel TFT 400 of the driving circuit 405 has a channel formation region 348, the fourth concentration impurity region 332 of the other conductivity type which is positioned so as to overlap the second electrode 324 that serves as a gate electrode, and the fifth concentration impurity region 333 of the other conductivity type which is placed outside of the second electrode 324.

The first n-channel TFT 401 has a channel formation region 349, the second concentration impurity region (LDD region) 331 of the one conductivity type which overlaps the second shape electrode 325 serving as a gate electrode, and the third concentration impurity region 328 of the one conductivity type that functions as a source region or a drain region. The length of the LDD in the channel length direction is 0.5 to 2.5 μm, preferably 1.5 μm. This LDD structure is for preventing TFT degradation caused mainly by hot carrier effect. The n-channel TFT and the p-channel TFT can be used to form a shift register circuit, a buffer circuit, a level shifter circuit, a latch circuit, etc. The structure of the first n-channel TFT 401 is suitable especially for a buffer circuit that is high in driving voltage because the structure can prevent degradation by hot carrier effect.

The second n-channel TFT 403 of the pixel portion 406 has a channel formation region 350, the first concentration impurity region 316 of the one conductivity type which is formed outside of the first shape electrode 313 serving as a gate electrode, and the third concentration impurity region 329 of the one conductivity type that functions as a source region or a drain region. A fifth concentration impurity region 336 of the other conductivity type is formed in the semiconductor film 307 that functions as one of electrodes of the capacitor portion 404.

As described above, the gate electrode of the driving circuit portion and the gate electrode of the pixel portion are structured differently from each other in this embodiment mode to obtain TFTs having different LDD structures. The LDD that overlaps a gate electrode can be formed in a self-aligning manner at high accuracy without using a photo mask.

Embodiment 1

An embodiment of the present invention will be described below with reference to FIGS. 1A to FIG. 6. Here, a detailed description is given on a method of simultaneously forming on the same substrate a TFT for a pixel portion and TFTs (an n-channel TFT and a p-channel TFT) for driving circuits that are placed in the periphery of the pixel portion.

In FIG. 1A, alumino borosilicate glass is used for a substrate 101. A first insulating film is formed on the substrate 101. The first insulating film in this embodiment is a laminate of a first silicon oxynitride film 102 with a thickness of 50 nm and a second silicon oxynitride film 103 with a thickness of 100 nm. The film 102 is formed using as reaction gas $SiH_4$, $NH_3$, and $N_2O$. The film 103 is formed using as reaction gas $SiH_4$ and $N_2O$.

Semiconductor films 104 to 107 are semiconductors having a crystal structure. The semiconductor films are obtained by forming an amorphous semiconductor film on the first insulating film and crystallizing the film through a known crystallization method. In this embodiment, an amorphous silicon film is formed by deposition to have a thickness of 50 nm and crystallized by irradiation of excimer laser light collected into a linear beam by an optical system. The laser light is set to have a power density of 300 mJ/cm$^2$ and is shaped into a 500 μm linear beam to irradiate the entire surface of the amorphous silicon film at an overlap ratio of 90 to 98%.

Alternatively, a continuous wave $YVO_4$ laser may be used. The laser is converted into second harmonic by a wavelength conversion element, and an energy beam of 10 W is run over the film at a rate of 1 to 100 cm/sec to crystallize the amorphous film.

After crystallization, the semiconductor films are doped with boron as an acceptor type impurity by ion doping in order to control the threshold voltage of the TFTs. The doping concentration of the impurity can be set suitably by an operator.

The thus obtained polycrystalline silicon film is divided into islands by etching treatment to form the semiconductor films 104 to 107. A silicon oxynitride film formed by plasma CVD using $SiH_4$ and $N_2O$ to have a thickness of 110 nm is formed as a second insulating film 108 on the semiconductor films.

A tantalum nitride film is formed as a first conductive film 109 on the second insulating film 108 by sputtering to have a thickness of 30 nm. Then, a tungsten film with a thickness of 300 nm is formed as a second conductive film 110.

Figure 30:
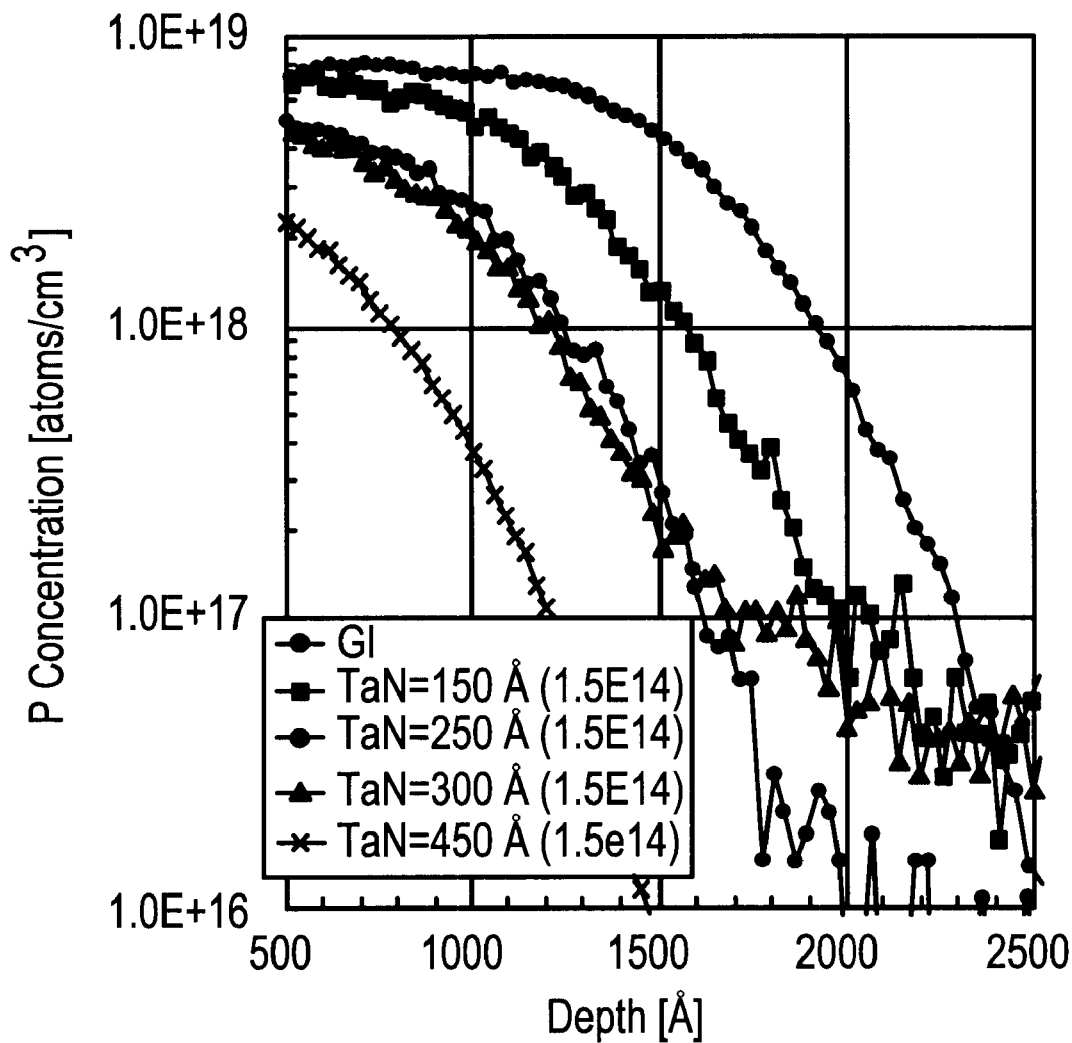
FIG. 30 is a graph showing the profile of phosphorus doping through a gate insulating film and a tantalum nitride film.
Figure 31:
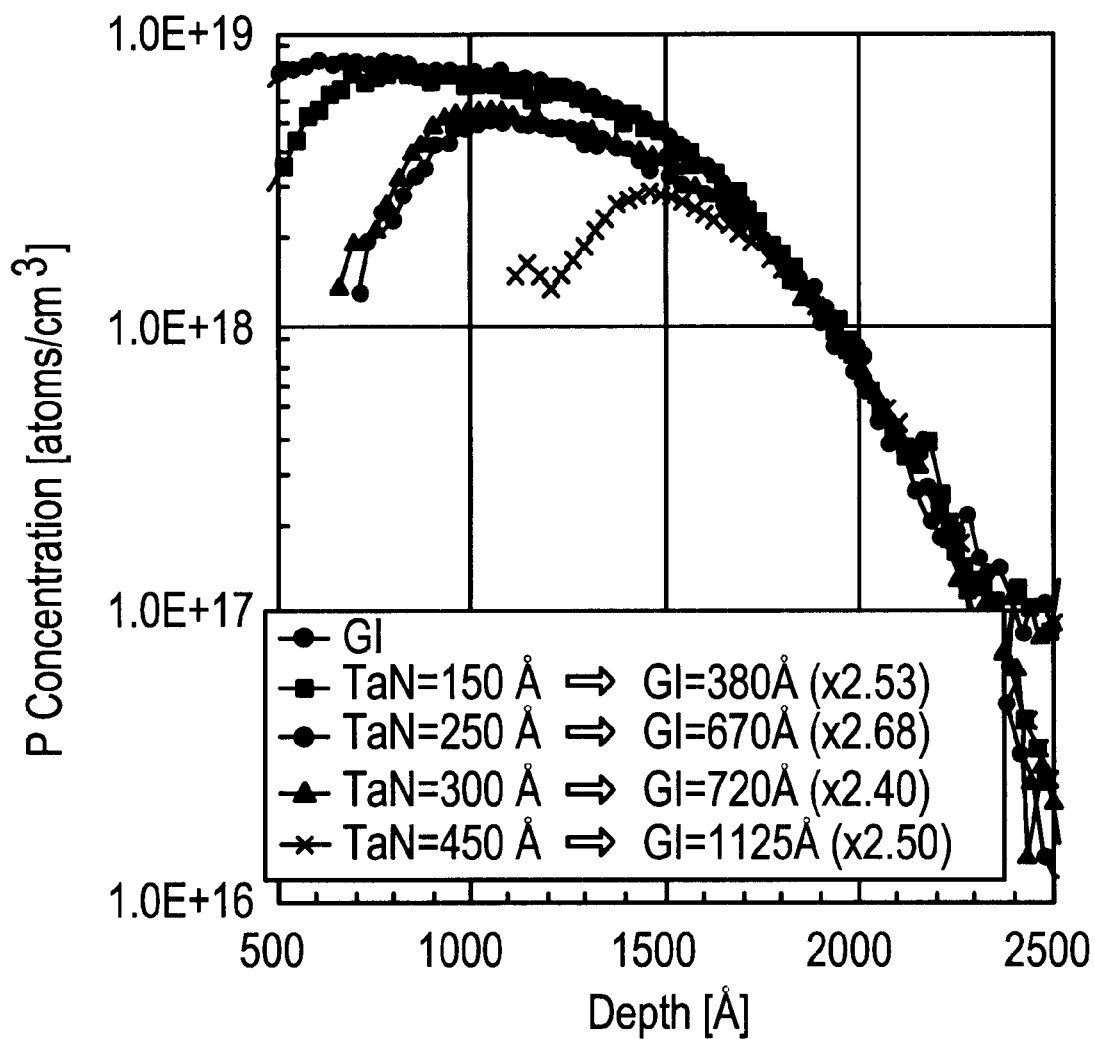
FIG. 31 is a graph obtained by fitting through conversion of the tantalum nitride film thickness into the gate insulating film thickness in which the former is multiplied by a constant.

The thickness of the tantalum nitride film is determined by taking into consideration the doping efficiency of phosphorus that is used as an n type impurity in ion doping (or the ability of the tantalum nitride film to block phosphorus). FIG. 30 shows the phosphorus concentration distribution when the gate insulating film thickness is constant and the tantalum nitride film thickness is changed from 15 nm to 45 nm. The acceleration voltage in the doping is set to 90 keV. The concentration of phosphorus injected to the semiconductor films varies depending on the thickness and materials of films (the gate insulating film and the tantalum nitride film) covering the semiconductor films. FIG. 31 shows the phosphorus concentration profile when the thickness of the tantalum nitride film is converted into the thickness of the gate insulating film. According to FIG. 31, a 2.4 to 2.66 times thicker gate insulating film equals in phosphorus blocking ability with a tantalum nitride film. In other words, tantalum nitride exhibits higher phosphorus blocking ability even though it is at smaller film thickness.

The thickness of the tantalum nitride film is determined by taking into consideration the resistance and the doping blocking ability. It can be concluded from FIGS. 30 and 31 that the optimal thickness range for the tantalum nitride film is between 15 nm to 300 nm.

Next, masks 111 to 114 are formed from a photosensitive resist material as shown in FIG. 1B. First etching treatment is then performed on the first conductive film 109 and the second conductive film 110. The etching treatment employs ICP (inductively coupled plasma) etching. No limitation is put on selection of etching gas but $CF_4$, $Cl_2$, and $O_2$ are used to etch a W film and a tantalum nitride film. The gas flow rate thereof is set to 25:25:10, and an RF (13.56 MHz) power of 500 W is given to a coiled electrode at a pressure of 1 Pa for the etching. In this case, the substrate side (sample stage) also receives an RF (13.56 MHz) power of 150 W to apply substantially negative self-bias voltage. Under these first etching conditions, mainly the W film is etched into a given shape.

Thereafter, the etching gas is changed to $CF_4$ and $Cl_2$. The gas flow rate thereof is set to 30:30, and an RF (13.56 MHz) power of 500 W is given to a coiled electrode at a pressure of 1 Pa to generate plasma for 30 second etching. The substrate side (sample stage) also receives an RF (13.56 MHz) power of 20 W to apply substantially negative self-bias voltage. The mixture gas of $CF_4$ and $Cl_2$ etches the tantalum nitride film and the W film at about the same rate. Thus formed are first shape electrodes 116 to 118 that are tapered around the edges and first shape wiring lines 114 and 115. The electrodes are tapered at an angle of 45 to 75°. In order to etch the films without leaving any residue on the second insulating film, it is preferable that the etching time is prolonged by 10 to 20%. Regions of the second insulating film 122 that are not covered with the first shape electrodes 116 to 118 and the first shape wiring lines 114 and 115 are etched and thinned by 20 to 50 nm.

First doping treatment employs ion doping in which ions are injected without mass separation. In the doping, the first shape electrodes 116 to 118 are used as masks and phosphine ($PH_3$) gas diluted with hydrogen or phosphine gas diluted with noble gas is employed to form first concentration n type impurity regions 123 to 126 in the semiconductor films 104 to 107. The first concentration n type impurity regions formed in this doping each have a phosphorus concentration of $1\times10^{17}$ to $1\times10^{19}$ atoms/cm$^3$.

Without removing the masks 111 to 114, second etching treatment is conducted next as shown in FIG. 2A. $CF_4$, $Cl_2$, and $O_2$ are used as etching gas, the gas flow rate thereof is set to 20:20:20, and an RF (13.56 MHz) power of 500 W is given to a coiled electrode at a pressure of 1 Pa to generate plasma for the etching. The substrate side (sample stage) also receives an RF (13.56 MHz) power of 20 W to apply a self-bias voltage lower than that in the first etching treatment. Under these etching conditions, the W film used as the second conductive film is etched. The W film is thus subjected to anisotropic etching to form second shape electrodes 127 to 129 and second shape wiring lines 130 and 131. Regions of the second insulating film that are not covered with the second shape electrodes 127 to 129 and the second shape wiring lines 130 and 131 are etched and thinned by 20 to 50 nm.

A mask 133 for covering the entire semiconductor film 104, a mask 134 for covering the second shape electrode 129 that is placed on the semiconductor film 106, and a mask 134 for covering the semiconductor film 107 are then formed for second doping treatment. Through the second doping treatment, a second concentration n type impurity region is formed in the semiconductor film 105 whereas third concentration n type impurity regions are formed in the semiconductor films 105 and 106. In this ion doping, phosphine is used and the dose is set to $1.5\times10^{14}$ atoms/cm$^3$, the acceleration voltage to 100 keV.

A second concentration n type impurity region 135 is formed in a self-aligning manner at a position overlapping a first conductive film 128a that constitutes the second shape electrode 128. The impurity given by ion doping transmits through the first conductive film 128a before the semiconductor film is doped. Therefore the second concentration is much lower than impurity concentration in the third concentration n type impurity regions. The impurity concentration in the region 135 is $1\times10^{16}$ to $1\times10^{17}$ atoms/cm$^3$. Third concentration impurity regions 136 and 137 are doped with phosphorus so as to achieve a concentration of $1\times10^{20}$ to $1\times10^{21}$ atoms/cm$^3$.

Next, a mask 138 is formed as shown in FIG. 3A to conduct third doping treatment. In the doping, diborane ($B_2H_6$) gas diluted with hydrogen or diborane gas diluted with noble gas is used to form a fourth concentration p type impurity region 139 and a fifth concentration p type impurity region 140 in the semiconductor film 104. The fourth concentration p type impurity region is positioned so as to overlap the second shape electrode 127 and is doped with boron in a concentration of $1\times10^{18}$ to $1\times10^{20}$ atoms/cm$^3$. The fifth concentration impurity region 140 is doped with boron in a concentration of $2\times10^{20}$ to $3\times10^{21}$ atoms/cm$^3$. A fifth concentration p type impurity region 142 and a fourth concentration p type impurity region 141 are formed in a part of the semiconductor film 107 that is used to form a storage capacitor in the pixel portion.

Through the above steps, either a region doped with phosphorus or a region doped with boron is given to each of the semiconductor films. The second shape electrodes 127 to 129 serve as gate electrodes. The second shape wiring line 130 forms one of electrodes that constitute the storage capacitor in the pixel portion. The second shape wiring line 131 serves as a data line in the pixel portion.

Next, a silicon oxynitride film is formed as a third insulating film 143 by plasma CVD to a thickness of 50 nm. Then the impurity elements used to dope the semiconductor films are activated by irradiating the semiconductor films with laser light of second harmonic (532 nm) of YAG laser as shown in FIG. 3B.

As shown in FIG. 4, a fourth insulating film 144 is then formed form silicon nitride by plasma CVD to a thickness of 50 nm. Heat treatment at 410° C. is conducted in a clean oven to hydrogenate the semiconductor films with hydrogen released from the silicon nitride film.

A fifth insulating film 145 is formed next on the fourth insulating film 144 from an acrylic. Then contact holes are formed. In this etching treatment, regions of the third to fifth insulating films that are placed in an external input terminal portion are removed. A titanium film and an aluminum film are layered to form wiring lines 146 to 149, a pixel electrode 151, a scanning line 152, a connection electrode 150, and a wiring line 153 that is connected to an external input terminal.

Thus formed on the same substrate are a driving circuit 205 that has a p-channel TFT 200 and a first n-channel TFT 201 and a pixel portion 206 that has a second n-channel TFT 203 and a capacitor portion 204. The capacitor portion 204 is composed of the semiconductor film 107, a part of the second insulating film 122, and the first shape capacitance wiring line 130.

The p-channel TFT 200 of the driving circuit 205 has a channel formation region 154, the fifth concentration p type impurity region 140 placed outside of the second electrode 127 that serves as a gate electrode (the region 140 functions as a source region or a drain region), and the fourth concentration p type impurity region that overlaps the second electrode 127.

The first n-channel TFT 201 has a channel formation region 155, the second concentration n type impurity region 124 (LDD) overlapping the second shape electrode 128 that serves as a gate electrode, and the third concentration n type impurity region 135 that functions as a source region or a drain region. The length of the LDD in the channel length direction is 0.5 to 2.5 µm, preferably 1.5 µm. This LDD structure is for preventing TFT degradation caused mainly by hot carrier effect. The n-channel TFT and the p-channel TFT can be used to form a shift register circuit, a buffer circuit, a level shifter circuit, a latch circuit, etc. The structure of the first n-channel TFT 201 is suitable especially for a buffer circuit that is high in driving voltage because the structure can prevent degradation by hot carrier effect.

The second n-channel TFT 203 of the pixel portion 206 has a channel formation region 156, the first concentration n type impurity region 125 formed outside of the second shape electrode 129 that serves as a gate electrode, and the third concentration n type impurity region 136 that functions as a source region or a drain region. P type impurity regions 141 and 142 are formed in the semiconductor film 107 that functions as one of electrodes of the capacitor portion 204.

The pixel portion 206 has the pixel electrode 151 and the connection electrode 150 that connects the data line 131 to the third concentration n type impurity region 136 of the semiconductor film 106. The pixel portion also has the gate wiring line 152, which, though not shown in the drawing, is connected to the second shape electrode 129 that functions as a gate electrode.

Figure 5:
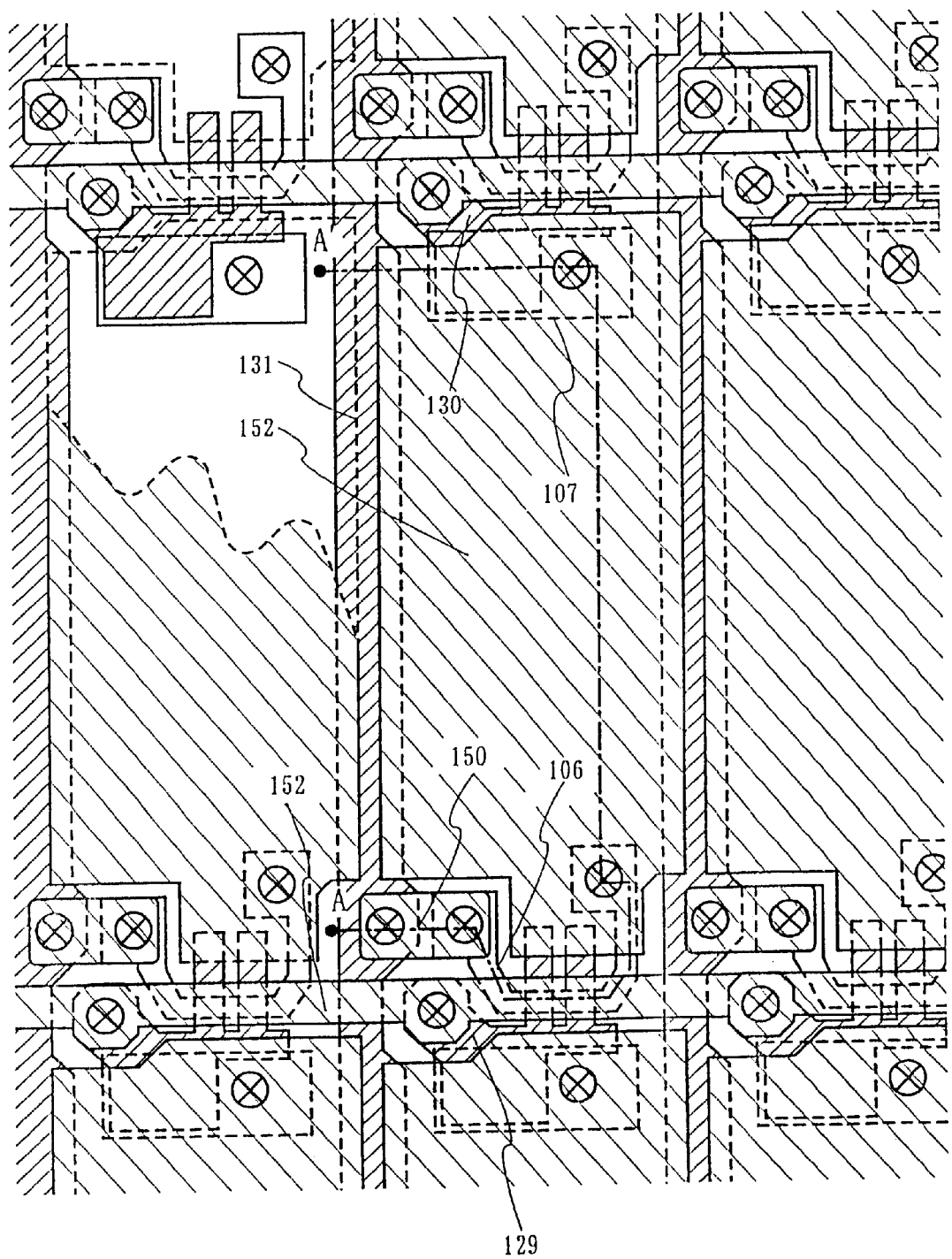
FIG. 5 is a top view illustrating the structure of a pixel portion of an active matrix substrate for a reflective display device.

A top view of the pixel portion 206 is shown in FIG. 5. The top view in FIG. 5 shows substantially one dot, and uses symbols common to those in FIG. 4. A sectional structure taken along the line A–A' in FIG. 5 corresponds to FIG. 4. In the pixel structure of FIG. 5, a gate wiring line and a gate electrode are formed on different layers so that the gate wiring line overlaps a semiconductor film and obtains an additional function as a light-shielding film. The edge of a pixel electrode is positioned so as to overlap a source wiring line in order to shield the gap between pixel electrodes against light. This structure eliminates the need to form a light-shielding film (black matrix). As a result, the aperture ratio is improved compared to prior art.

As described above, the present invention makes it possible to form on the same substrate an n-channel TFT having LDD that overlaps a gate electrode and an n-channel TFT having LDD that does not overlap a gate electrode. The two types of TFTs are separately arranged corresponding to circuits of different operation conditions, for example, one TFT in a driving circuit portion and the other TFT in a pixel portion. This is premised on the p-channel TFT having a single drain structure.

Figure 6:
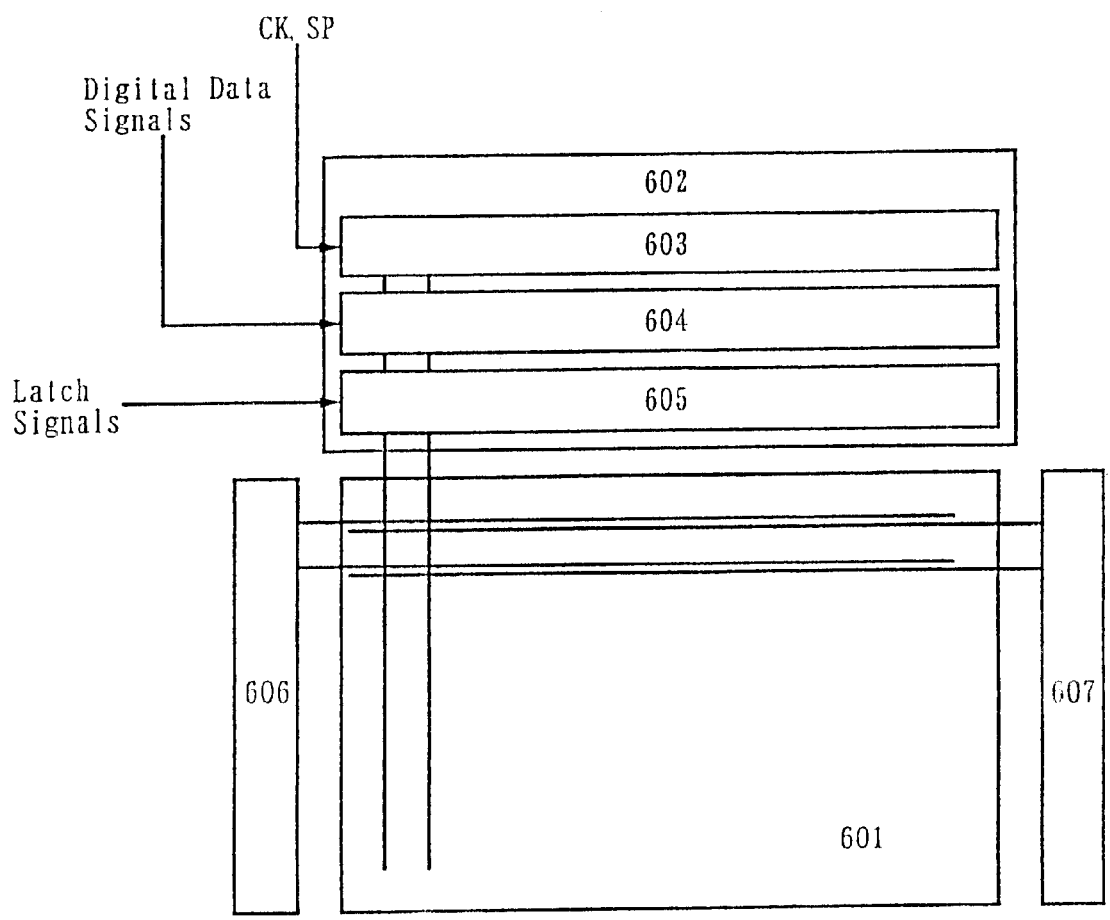
FIG. 6 is a diagram illustrating the circuit structure of an active matrix substrate.

FIG. 6 is a circuit block diagram showing an example of the circuit structure of the active matrix substrate. The substrate shown in FIG. 6 has a pixel portion 601, a data signal line driving circuit 602, and a scanning signal line driving circuit 606 that are composed of TFTs.

The data signal line driving circuit 602 is composed of a shift register 603, latches 604 and 605, a buffer circuit, and other circuits. Clock signals and start signals are inputted to the shift register 603. Digital data signals and latch signals are inputted to the latches. The scanning signal line driving circuit 606 is also composed of a shift register, a buffer circuit, and others. The pixel portion 601 can have an arbitrary number of pixels. If a display device aims at the XGA level, the pixel portion has to have 1024×768 pixels.

This active matrix substrate can be used to manufacture a display device of active matrix driving. The active matrix substrate in this embodiment has its pixel electrode formed from a light reflective material, and therefore can make a reflective liquid crystal display device. A liquid crystal display device as well as a light emitting device in which an organic light emitting device is used for a pixel portion can be manufactured from the active matrix substrate. In this way, an active matrix substrate for a reflective display device is obtained.

Embodiment 2

Another embodiment of the present invention will be described with reference to FIGS. 7A to 10. This embodiment also gives a description on a method of simultaneously forming on the same substrate a TFT for a pixel portion and TFTs (an n-channel TFT and a p-channel TFT) for driving circuits that are placed in the periphery of the pixel portion. The description on the substrate, the insulating films, the semiconductor films, and the conductive films in Embodiment 1 applies to a substrate 301, first insulating films 302 and 303, semiconductor films 304 to 307, a second insulating film 308, a first conductive film 309, and a second conductive film 310 in FIG. 7A.

Masks 311 and 312 are formed in FIG. 7B. The mask 311 covers the driving circuit portion whereas the mask 312 covers the pixel portion. With the masks covering the pixel and driving circuit portions, first etching treatment is conducted to form a first shape electrode 313 and first shape wiring lines 314 and 315 (the electrode is composed of a first conductive film 313a and a second conductive film 313b, the wiring line 314 of a first conductive film 314a and a second conductive film 314b, the wiring line 315 of a first conductive film 315a and a second conductive film 315b). The etching conditions are identical with those of the first etching treatment in Embodiment 1. Next, the semiconductor films 306 and 307 are doped with phosphorus as an impurity in first doping treatment by ion doping to form first concentration n type impurity regions 316 and 360. The first concentration n type impurity regions each have a phosphorus concentration of $1\times10^{17}$ to $1\times10^{19}$ atoms/cm$^3$.

The masks 311 and 312 are removed and then a mask 317 that covers the first shape electrode 313 and the first shape wiring lines 314 and 315 is formed as shown in FIG. 8A. Further, masks 318 to 320 are formed on the driving circuit portion to form first shape electrodes 321 to 323 in the driving circuit portion through second etching treatment. The second etching treatment is set to the same conditions as the first etching treatment conditions of this embodiment.

The second etching treatment is followed by third etching treatment as shown in FIG. 8B. The third etching treatment is for selectively etching the W film that is formed as the second conductive film. As a result, second shape electrodes 324 to 326 that have projections of first conductive films 324a to 326a are formed. The etching conditions in the third etching treatment are the same as the etching conditions in the second etching treatment of Embodiment 1.

The second shape electrodes 324 and 325 are used as masks in second doping treatment, utilizing the film thickness difference between the first conductive films 324a and 325a and the second conductive films 324b and 325b. As a result, the semiconductor films 304 and 305 are doped with phosphorus to form n type impurity regions. The second doping treatment uses 5% $PH_3$ diluted with hydrogen and sets the dose to $1.6 \times 10^{14}$ atoms/cm$^3$, the acceleration voltage to 100 keV. This makes it possible to form second concentration n type impurity regions 330 and 331 and third concentration n type impurity regions 327 and 328 in one doping. The second concentration n type impurity regions 330 and 331 are positioned so as to overlap the second shape electrodes, and have a phosphorus concentration of $1 \times 10^{16}$ to $1 \times 10^{17}$ atoms/cm$^3$ due to the presence of the first conductive film. The third concentration n type impurity regions 327 and 328 are formed in regions outside the second shape electrodes, and have a phosphorus concentration of $1 \times 10^{20}$ to $1 \times 10^{21}$ atoms/cm$^3$. A third concentration n type impurity region 329 is formed in the semiconductor film 306.

Thereafter, masks 332 and 333 are formed as shown in FIG. 9A to dope the semiconductor film 304 with boron through third doping treatment. The resultant impurity regions are a fourth concentration p type impurity region 335 and a fifth concentration p type impurity region 334. A fifth concentration p type impurity region 336 is formed in the semiconductor film 307.

Subsequent steps are identical with the steps in Embodiment 1. A third insulating film 337 is formed and the impurities used to dope the semiconductor films are activated. A fourth insulating film 338 is then formed as shown in FIG. 10 and is subjected to heat treatment at 410° C. to hydrogenate the semiconductor films. A fifth insulating film 339 is formed next on the fourth insulating film 338 from an organic insulating material. Then, contact holes are formed by etching treatment. Wiring lines 340 to 343, a pixel electrode 345, a gate line 346, and wiring lines 344 and 347 are formed.

Thus formed on the same substrate are a driving circuit 405 that has a p-channel TFT 400 and a first n-channel TFT 401 and a pixel portion 406 that has a second n-channel TFT 403 and a capacitor portion 404. The capacitor portion 404 is composed of the semiconductor film 307, a part of a second insulating film 361, and the first shape capacitance wiring line 314.

The p-channel TFT 400 of the driving circuit 405 has a channel formation region 348, the fourth concentration impurity region 332 of the other conductivity type which is positioned so as to overlap the second electrode 324 that serves as a gate electrode, and the fifth concentration impurity region 333 of the other conductivity type which is placed outside of the second electrode 324.

The first n-channel TFT 401 has a channel formation region 349, the second concentration impurity region (LDD region) 331 of the one conductivity type which overlaps the second shape electrode 325 serving as a gate electrode, and the third concentration impurity region 328 of the one conductivity type which functions as a source region or a drain region. The length of the LDD in the channel length direction is 0.5 to 2.5 μm, preferably 1.5 μm. This LDD structure is for preventing TFT degradation caused mainly by hot carrier effect. The n-channel TFT and the p-channel TFT can be used to form a shift register circuit, a buffer circuit, a level shifter circuit, a latch circuit, etc. The structure of the first n-channel TFT 401 is suitable especially for a buffer circuit that is high in driving voltage because the structure can prevent degradation by hot carrier effect.

The second n-channel TFT 403 of the pixel portion 406 has a channel formation region 350, the first concentration impurity region 316 of the one conductivity type which is formed outside of the first shape electrode 313 serving as a gate electrode, and the third concentration impurity region 329 of the one conductivity type which functions as a source region or a drain region. A fifth concentration impurity region 336 of the other conductivity type is formed in the semiconductor film 307 that functions as one of electrodes of the capacitor portion 404.

As described above, the gate electrode of the driving circuit portion and the gate electrode of the pixel portion are structured differently from each other in this embodiment to obtain TFTs having different LDD structures. The LDD that overlaps a gate electrode can be formed in a self-aligning manner at high accuracy without using a photo mask. An active matrix substrate for a reflective display device is thus obtained.

Embodiment 3

This embodiment describes the structure of an active matrix substrate for a transmissive display device with reference to FIGS. 11A and 11B. FIGS. 11A and 11B show the structure of the pixel portion 406 in the active matrix substrate formed in Embodiment 2. The second n-channel TFT 403 and the capacitor portion 404 are obtained in accordance with Embodiment 2.

FIG. 11A shows contact holes formed after the fourth insulating film 338 and the fifth insulating film 339 are formed and a transparent electrode 370 that is patterned into a given shape on the fifth insulating film 339. The transparent conductive film 370 is 100 nm in thickness. Indium oxide, tin oxide, or zinc oxide, or a compound of these oxides can be used to form the transparent conductive film. A transparent conductive film 371 is formed on the terminal portion.

Electrodes 373 and 374 that are connected to the transparent electrode 370 are formed next as shown in FIG. 11B, as well as a gate line 375 and a connection electrode 372. The electrodes 373, 374, and 372 and the line 375 are formed from a laminate consisting of a titanium film with a thickness of 100 nm and an aluminum film with a thickness of 300 nm. The active matrix substrate is structured as above to make a transmissive display device. The structure of this embodiment can be applied to the active matrix substrate of Embodiment 1.

Embodiment 4

This embodiment describes a process of manufacturing a liquid crystal display device of active matrix driving from the active matrix substrate obtained in Embodiment 3. The description is given with reference to FIG. 12.

After the active matrix substrate in the state of FIG. 11B is obtained, an oriented film 383 is formed on the active matrix substrate and subjected to rubbing treatment. Though not shown in the drawing, prior to the oriented film 383, columnar spacers may be formed at desired positions by patterning an organic resin film such as an acrylic resin film. The spacers are for keeping distance between substrates. Instead of columnar spacers, spherical spacers may be sprayed onto the entire surface of the substrate.

Next, an opposite electrode 381 is formed on an opposite substrate 380, and an oriented film 382 is formed on the electrode and subjected to rubbing treatment. The opposite electrode 381 is formed of ITO. Then, the opposite substrate is bonded to the active matrix substrate on which the pixel portion and the driving circuits are formed, using a sealing agent (not shown). The sealing agent has a filler mixed therein and the filler, together with the spacers, keeps the distance between the two substrates while they are bonded. Then, a liquid crystal material 385 is injected between the substrates and an end-sealing agent is used to completely seal the substrates. A known liquid crystal material can be used as the material 385.

Figure 12:
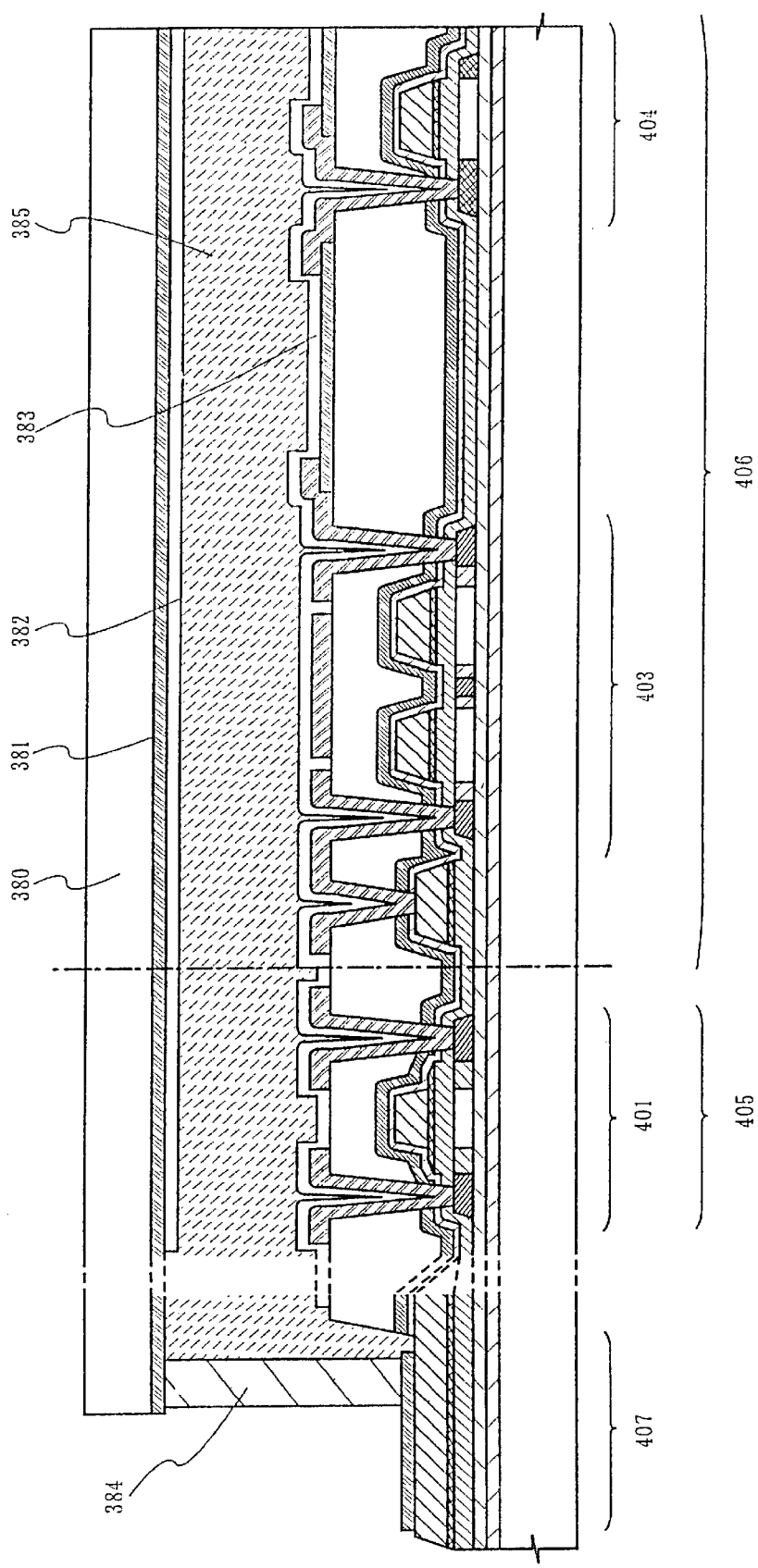
FIG. 12 is a sectional view showing the structure of a transmissive liquid crystal display device.

Thus completed is the active matrix driving liquid crystal display device shown in FIG. 12. The transmissive active matrix substrate manufactured in Embodiment 3 is used in the example shown here, but the reflective active matrix substrate manufactured in Embodiment 1 or 2 also can make a liquid crystal display device.

Embodiment 5

Figure 13:
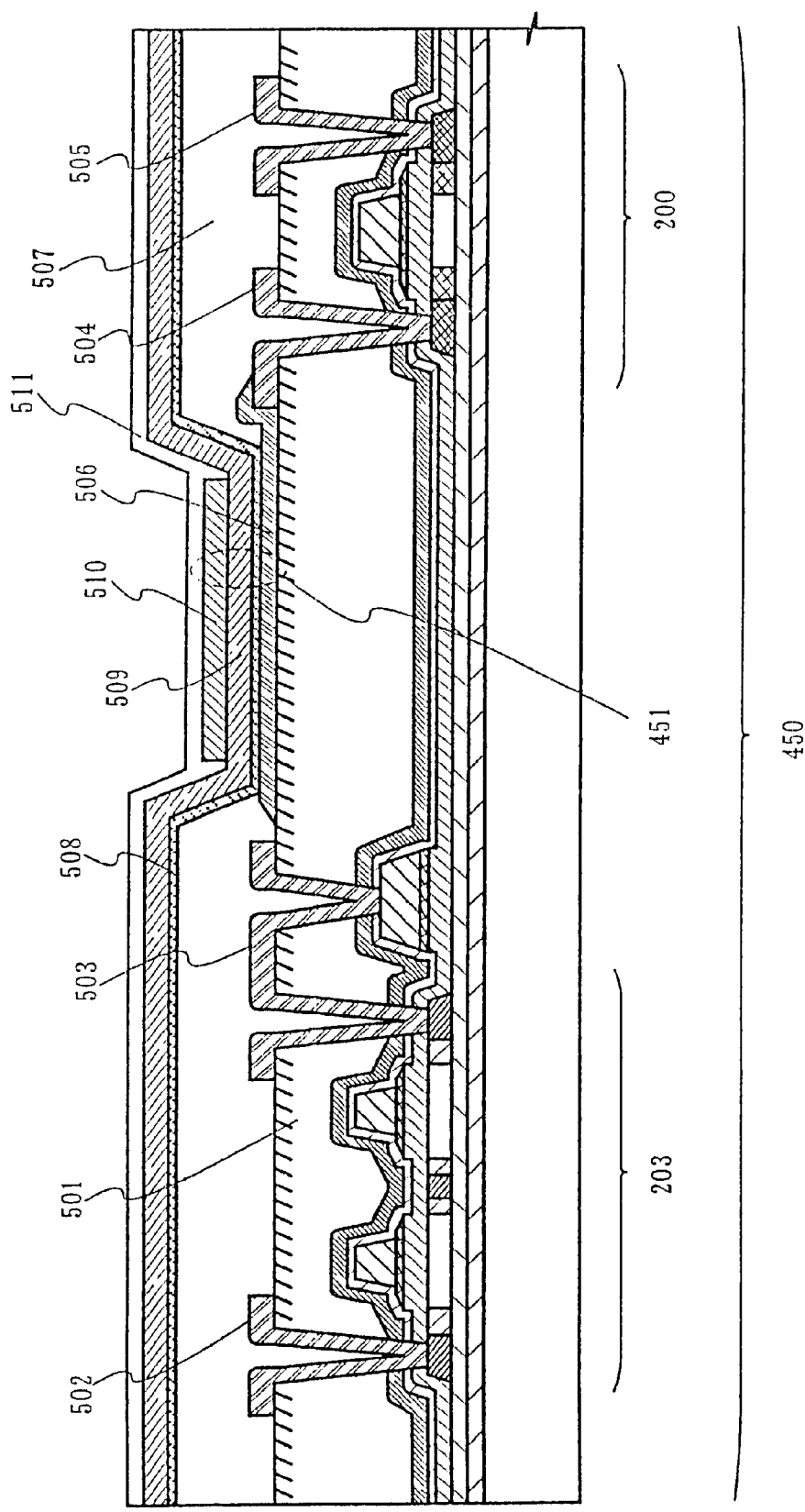
FIG. 13 is a sectional view illustrating the structure of a pixel portion in a light emitting device.

FIG. 13 shows an example of the structure of a pixel portion in a light emitting device of active matrix driving method to which the present invention is applied. An n-channel TFT 203 and a p-channel TFT 200 of a pixel portion 450 are manufactured in accordance with the process of Embodiment 1. The surface of a fifth insulating film 501 is made dense by plasma treatment using nitrogen or inert gas. Typically, argon plasma treatment is employed and the densification is achieved by forming on the surface a very thin film that mainly contains carbon. Then, contact holes are formed to form wiring lines. Titanium, aluminum, and the like are used for the wiring lines.

In the pixel portion 450, a data line 502 is connected to the source side of the n-channel TFT 203 and a wiring line 503 on the drain side is connected to a gate electrode of the n-channel TFT 203. The source side of the p-channel TFT 200 is connected to a power supply wiring line 505 whereas an electrode 504 on the drain side is connected to an anode of a light emitting element 451.

The light emitting device in this embodiment has organic light emitting devices arranged to form a matrix. An organic light emitting device 451 is composed of an anode, a cathode, and an organic compound layer that is formed between the anode and the cathode. An anode 506 is formed from ITO after the wiring lines are formed. The organic compound layer contains a combination of a hole transporting material of higher hole mobility, an electron transporting material of higher electron mobility, a light emitting material, and others. These materials may be formed into layers or may be mixed into one.

The organic compound materials in total make a thin film of about 100 nm. Accordingly, the surface of the ITO film for forming the anode has to be leveled well. If the surface is poorly leveled, at worst, it can cause a short circuit with the cathode formed on the organic compound layer. The short circuit may be avoided by another measure, namely, by forming an insulating layer 508 with a thickness of 1 to 5 nm. The insulating layer 508 is formed from polyimide, polyimideamide, polyamide, acrylic, or the like.

A cathode 510 is formed from an alkaline metal such as MgAg or LiF, or from an alkaline earth metal. Details about the structure of the organic compound layer 509 may be set freely.

The organic compound layer 509 and the cathode 510 cannot receive wet treatment (etching with chemicals, water washing, or like other treatment). Therefore, a partition wall layer 507 is formed from a photosensitive resin material on the organic insulating film 501, skirting the anode 506. The edge of the anode 506 is covered with the partition wall layer 507. Specifically, a negative resist is applied and baked to give the partition wall layer 507a thickness of 1 to 2 µm. Alternatively, the partition wall layer is formed from a photosensitive acrylic or photosensitive polyimide.

A material containing magnesium (Mg), lithium (Li), or calcium (Ca) small in work function is used for the cathode 510. Preferably, the electrode is formed from MgAg (a material obtained by mixing Mg and Ag at a ratio of Mg:Ag=10:1). Examples of other electrodes usable as the cathode 510 include a MgAgAl electrode, a LiAl electrode, and a LiFAl electrode. On the cathode, an insulating film 511 that is a silicon nitride film or a DLC film is formed to have a thickness of 2 to 30 nm, preferably 5 to 10 nm. A DLC film can be formed by plasma CVD and can cover the edge of the partition wall layer 507 well even when it is formed at 100° C. or lower. The internal stress of a DLC film can be eased by mixing a minute amount of argon therein, allowing the film to serve as a protective film. A DLC film is an excellent gas barrier against oxygen as well as CO, $CO_2$, and $H_2O$, and is therefore suitable for the insulating film 511 that is used as a barrier film.

In FIG. 13, the n-channel TFT 203 used for switching has a multi-gate structure whereas the p-channel TFT 200 used for current control has LDD overlapping a gate electrode. The present invention is capable of forming TFTs of different LDD structures by the same process. The example shown in FIG. 13 is a preferred application of the present invention to a light emitting device, where TFTs having different LDD structures are formed in the pixel portion to suit their different functions (the n-channel TFT 203 with the OFF current lowered for switching and the p-channel TFT 200 strong against hot carrier injection for current controlling). As a result, a highly reliable light emitting device capable of excellent image displaying (in other words, a high-performance light emitting device) can be obtained.

Figure 14:
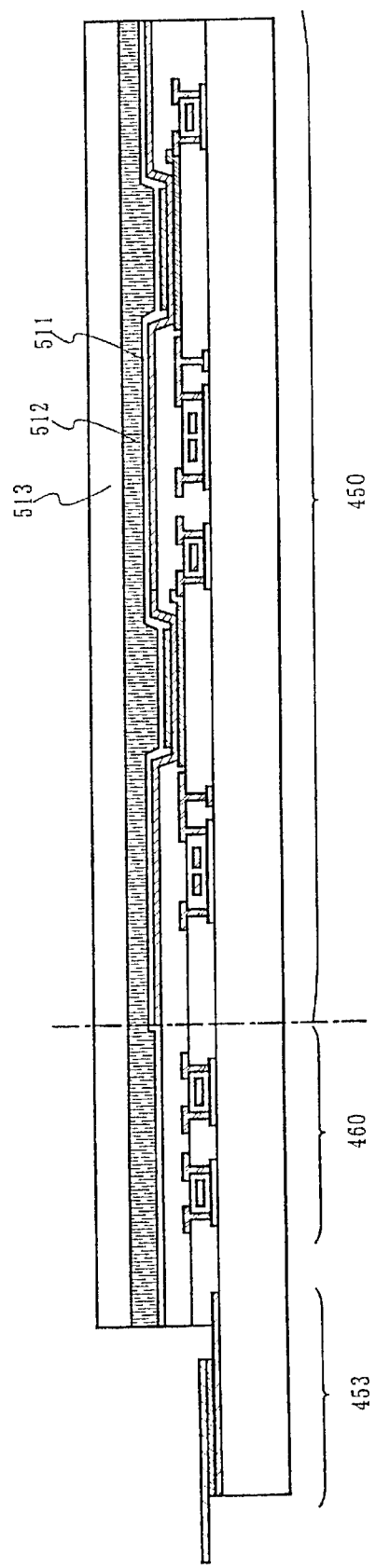
FIG. 14 is a sectional view showing the structure of a light emitting device.

FIG. 14 is a diagram showing the structure of the light emitting device that has the pixel portion 450 described above and a driving circuit portion 460. On the insulating film 511 formed in the pixel portion 450, an organic resin 511 is placed to fill the space between the insulating film and a substrate 512. The device is thus sealed. The airtightness may be further enhanced by providing a sealing member around the edges. A flexible printed circuit (FPC) is attached to a terminal portion 453.

Figure 15:
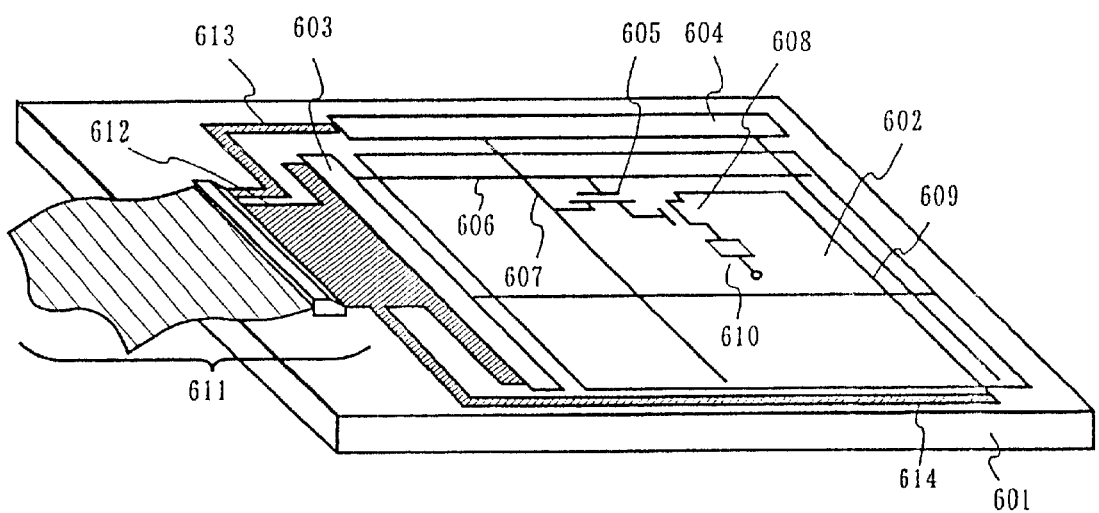
FIG. 15 is a perspective view illustrating the structure of an active matrix substrate.

Now, a perspective view in FIG. 15 is used to describe the structure of the active matrix self-luminous device of this embodiment. The active matrix driving light emitting device of this embodiment has on a glass substrate 601a pixel portion 602, a signal line driving circuit 603, and a data line driving circuit 604. A switching TFT 605 in the pixel portion is an n-channel TFT, and is placed at the intersection of a gate wiring line 606 and a source wiring line 607. The gate wiring line is connected to the gate side driving circuit 603 and the source wiring line is connected to the source side driving circuit 604. A drain region of the switching TFT 605 is connected to a gate of a current controlling TFT 608.

The data line side of the current controlling TFT 608 is connected to a power supply line 609. In the structure of this embodiment, ground electric potential (earth electric potential) is given to the power supply line 609. A drain region of the current controlling TFT 608 is connected to an organic light emitting device 610. A given voltage (10 to 12 V, in this embodiment) is applied to a cathode of the organic light emitting device 610.

An FPC 611 serving as an external input/output terminal is provided with input/output wiring lines (connection wiring lines) 612 and 613 for sending signals to the driving circuits, and an input/output wiring line 614 connected to the power supply line 609. As described above, the TFTs and the organic light emitting device are combined to constitute the pixel portion of the light emitting device.

Embodiment 6

An example of forming the semiconductor film used in Embodiment 1 or 2 will be described with reference to FIGS. 16A to 16E. The method illustrated in FIGS. 16A to 16E involves gettering that is conducted after the entire surface of a semiconductor film having an amorphous structure is doped with a metal element having a catalytic function for crystallization.

Figure 16A:
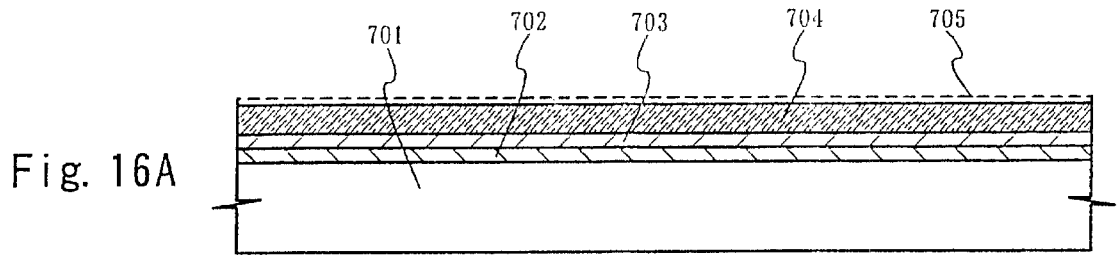
FIGS. 16A to 16E are diagrams illustrating a process of manufacturing a semiconductor film that has a crystal structure.

In FIG. 16A, a substrate 701 is formed from, not limitedly but preferably barium borosilicate glass, alumino borosilicate glass, or quartz. A first insulating film is formed on the surface of the substrate 701. The first insulating film consists of a first silicon oxynitride film 702 formed by plasma CVD to have a thickness of 50 nm from $SiH_4$, $NH_3$, and $N_2O$, and a second silicon oxynitride film 703 formed by plasma CVD to have a thickness of 100 nm from $SiH_4$ and $N_2O$. The first insulating film is provided to prevent an alkaline metal contained in the glass substrate from diffusing in a semiconductor film to be formed thereon. If quartz is used to form the substrate, the first insulating film may be omitted.

A semiconductor material mainly containing silicon is used for a semiconductor film 704 that has an amorphous structure and is formed on the first insulating film. Typically, the semiconductor film 704 is an amorphous silicon film or amorphous silicon germanium film formed by plasma CVD, reduced pressure CVD, or sputtering to have a thickness of 10 to 100 nm. In order to obtain satisfactory quality crystals, the concentration of impurities such as oxygen and nitrogen contained in the semiconductor film 704 having an amorphous structure should be reduced to $5 \times 10^{18}$ atoms/cm$^3$ or lower. These impurities hinder crystallization of an amorphous semiconductor and, after crystallization, increase the density of trap center and recombination center. Therefore, it is desirable to use an ultra vacuum CVD apparatus equipped with a mirror finish (field polishing treatment) reaction chamber and an oil-free vacuum exhaust system, as well as to use a material gas of high purity.

Thereafter, the surface of the semiconductor film 704 having an amorphous structure is doped with a metal element having a catalytic effect that accelerates crystallization. Examples of the metal element having a catalytic effect that accelerates crystallization of a semiconductor film include iron (Fe), nickel (Ni), cobalt (Co), ruthenium (Ru), rhodium (Rh), palladium (Pd), osmium (Os), iridium (Ir), platinum (Pt), copper (Cu), and gold (Au). One or more kinds of metal elements selected from the above can be used. Typically, nickel is chosen and a nickel acetate solution containing 1 to 100 ppm of nickel by weight is applied by a spinner to form a catalyst-containing layer 705. To make sure the solution is applied well, surface treatment is performed on the semiconductor film 704 having an amorphous structure. The surface treatment includes forming a very thin oxide film from an ozone-containing aqueous solution, etching the oxide film with a mixture of fluoric acid and a hydrogen peroxide aqueous solution to form a clean surface, and again forming a very thin oxide film from the ozone-containing solution. Since a surface of a semiconductor film such as a silicon film is inherently hydrophobic, the nickel acetate solution can be applied evenly by forming an oxide film in this way.

The method of forming the catalyst-containing layer 705 is not limited thereto, of course, and sputtering, evaporation, plasma treatment, or the like may be used instead. The catalyst-containing layer 705 may be formed prior to the semiconductor film 704 having an amorphous structure, in other words, may be formed on the first insulating film.

While keeping the semiconductor film 704 having an amorphous structure in contact with the catalyst-containing later 705, heat treatment for crystallization is carried out. Furnace annealing using an electric furnace, or rapid thermal annealing (hereinafter referred to as RTA) using a halogen lamp, a metal halide lamp, a xenon arc lamp, a carbon arc lamp, a high pressure sodium lamp, a high pressure mercury lamp, etc. is employed for the heat treatment. Considering the productivity, RTA is preferred.

Figure 16B:
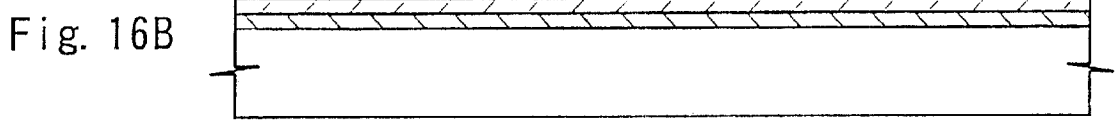

If RTA is chosen, a lamp light source for heating is lit for 1 to 60 seconds, preferably 30 to 60 seconds, which is repeated 1 to 10 times, preferably 2 to 6 times. The intensity of light emitted from the lamp light source can be set arbitrarily, as long as the semiconductor film is heated to reach 600 to 1000° C., preferably 650 to 750° C., in an instant. When the temperature thereof reaches this high, the semiconductor film alone is instantaneously heated and the substrate 700 is not deformed. The semiconductor film having an amorphous structure is thus crystallized to obtain a semiconductor film 706 having a crystal structure which is shown in FIG. 16B. Crystallization by such treatment is achieved only when the catalyst-containing layer is provided.

If furnace annealing is chosen instead, heat treatment at 500° C. is conducted for an hour to release hydrogen contained in the semiconductor film 704 having an amorphous structure prior to the heat treatment for crystallization. Then, the substrate receives heat treatment in an electric furnace in a nitrogen atmosphere at 550 to 600° C., preferably at 580° C., for four hours to crystallize the semiconductor film. The semiconductor film 706 having a crystal structure and shown in FIG. 16B is thus formed.

It is effective to irradiate the semiconductor film 706 having a crystal structure with laser light in order to raise the crystallization ratio (the ratio of crystal components to the entire volume of the film) and repair defects remaining in crystal grains. Examples of the laser light usable include excimer laser light having an wavelength of 400 nm or less and second or third harmonic of YAG laser. In any case, pulse laser light having a repetition frequency of 10 to 1000 Hz is used and collected by an optical system into a beam of 100 to 400 mJ/cm$^2$ to irradiate the semiconductor film 706 having a crystal structure at an overlap ratio of 90 to 95%.

The thus obtained semiconductor film 706 having a crystal structure has a remaining catalytic element (nickel, here). Though the catalytic element is not uniformly distributed in the film, the concentration thereof higher than $1 \times 10^{19}$ atoms/cm$^3$ in average. The semiconductor film with the catalytic element remained therein can form a TFT and other semiconductor elements but it is preferred to remove the remaining catalytic element by gettering in accordance with the following method.

Figure 16C:
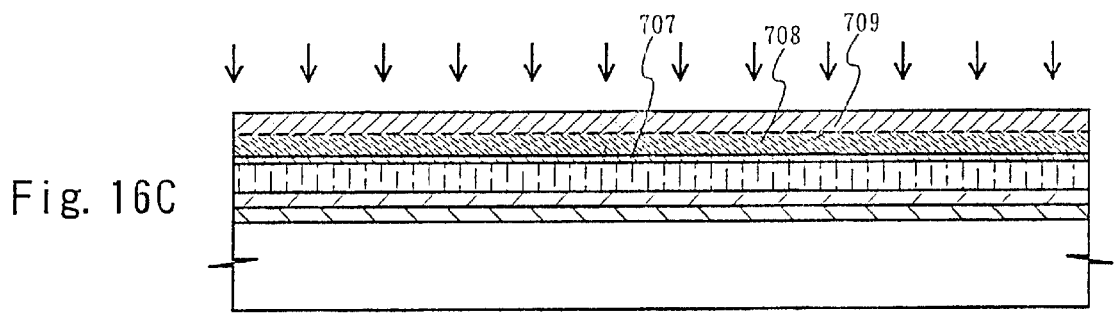
Figure 16D:
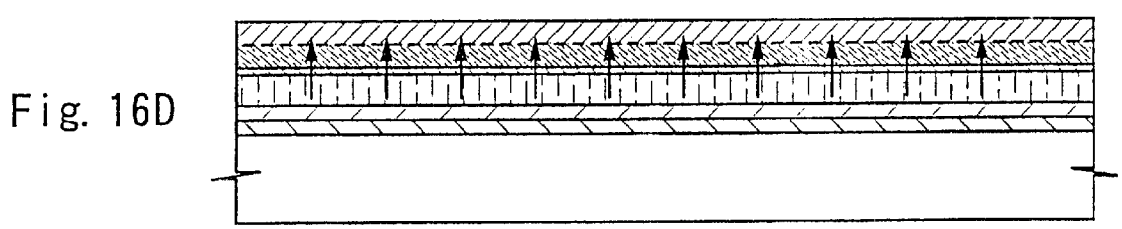

First, a thin barrier layer 707 is formed on the surface of the semiconductor film 706 having a crystal structure as shown in FIG. 16C. The thickness of the barrier layer is not particularly limited. A simple way to obtain the barrier layer is to form a chemical oxide by treating the surface with ozone water. A chemical oxide can be formed also when treating with an aqueous solution in which hydrogen peroxide water is mixed with sulfuric acid, hydrochloric acid, or nitric acid. Other usable methods include plasma treatment in an oxidization atmosphere, and oxidization treatment by ozone generated through UV irradiation in an atmosphere containing oxygen. Alternatively, a thin oxide film formed by heating in a clean oven until it reaches 200 to 350° C. may be used as the barrier layer. An oxide film formed by plasma CVD, sputtering, or evaporation to have a thickness of 1 to 5 nm may also be used as the barrier layer.

On the barrier layer, a semiconductor film 708 is formed to have a thickness of 25 to 250 nm. The semiconductor film 708 is typically an amorphous silicon film containing 0.01 to 20 atomic % of argon which is formed by sputtering using argon. The semiconductor film 708, which is to be removed later, is preferably a low density film in order to increase the selective ratio to the semiconductor film 706 having a crystal structure in etching. When an amorphous silicon film is doped with a noble gas element to take the noble gas element in, a gettering site is obtained.

One or more kinds of elements selected from the group consisting of helium (He), neon (Ne), argon (Ar), krypton (Kr), and xenon (Xe) are used as the noble gas element. The present invention is characterized in that the noble gas elements are used as ion sources to form a gettering site and that the noble gas elements are injected to the semiconductor film by ion doping or ion implantation. There are two reasons for injection of ions of the noble gas elements. One is to form dangling bonds by the injection so that the semiconductor film is distorted. The other is to give distortion by injecting the ions in lattice cells. Both of the purposes are fulfilled by injecting ions of inert gas. In particular, the latter is achieved markedly well when an element that is larger in atom radius than silicon, such as argon (Ar), krypton (Kr), or xenon (Xe), is used.

To make sure the gettering is conducted thoroughly, heat treatment is needed at this point. The heat treatment is achieved by furnace annealing or RTA. If furnace annealing is chosen, heat treatment is conducted in a nitrogen atmosphere at 450 to 600° C. for 0.5 to 12 hours. If RTA is chosen, a lamp light source for heating is lit for 1 to 60 seconds, preferably 30 to 60 seconds, which is repeated 1 to 10 times, preferably 2 to 6 times. The intensity of light emitted from the lamp light source can be set arbitrarily, as long as the semiconductor film is heated to reach 600 to 1000° C., preferably 700 to 750° C., in an instant.

Figure 16E:
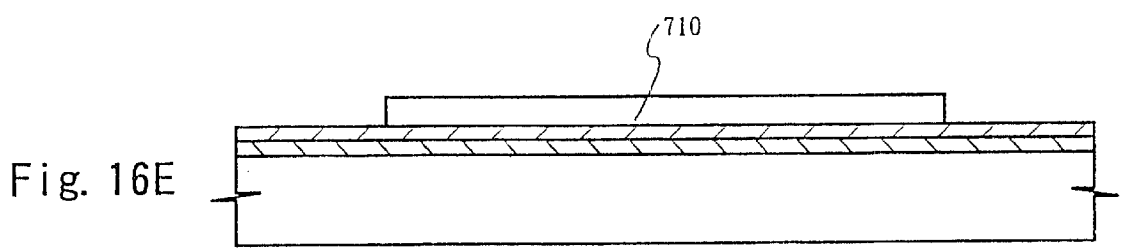

During gettering, the catalytic element in a to-be-gettered region (trap site) is released by thermal energy and is moved to the gettering site through diffusion. Accordingly, gettering is dependent on the process temperature and gettering progresses in a shorter period of time at a higher temperature. In FIG. 16E, the distance the catalytic element moves during gettering is about the same as the thickness of the semiconductor film, and therefore gettering in the present invention is completed in a relatively short period of time.

This heat treatment does not crystallize the semiconductor film 708 that contains a noble gas element in a concentration of $1 \times 10^{20}$ atoms/cm$^3$ or higher. This is supposedly because the noble gas element is not re-discharged in the above process temperature range and the remaining elements hinder crystallization of the semiconductor film.

After the gettering step is ended, the amorphous semiconductor film 708 is removed by selective etching. The etching method employed may be dry etching by ClF$_3$ without using plasma, or wet etching using hydrazine or an alkaline solution such as an aqueous solution that contains tetraethyl ammonium hydroxide (chemical formula: (CH$_3$)$_4$NOH). The barrier layer 707 functions as an etching stopper at this point. Thereafter, the barrier layer 707 is removed using fluoric acid.

In this way, a semiconductor film 710 having a crystal structure in which the concentration of the catalytic element is reduced to $1 \times 10^{17}$ atoms/cm$^3$ or lower is obtained as shown in FIG. 16E. The thus formed semiconductor film 710 having a crystal structure is a mass of thin rod-like crystals, or thin flattened rod-like crystals due to the effect of the catalytic element. Macroscopically, each of the crystals grows with a specific orientation. The semiconductor film 710 formed in accordance with this embodiment to have a crystal structure can be applied to the semiconductor film of Embodiment 1 or 2.

Embodiment 7

Figure 17A:
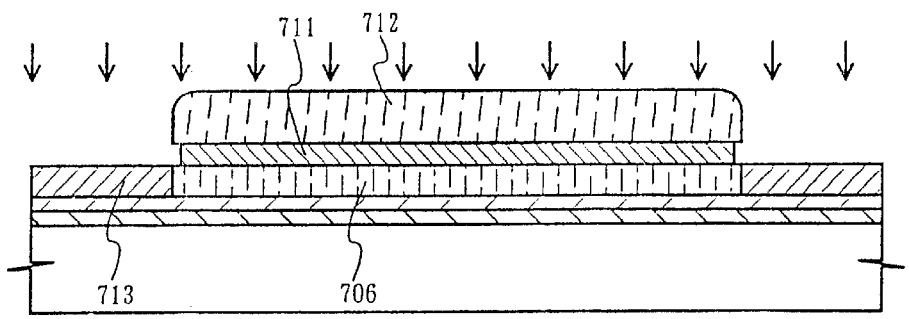
FIGS. 17A to 17C are diagrams illustrating a process of manufacturing a semiconductor film that has a crystal structure.

Another method of gettering the catalytic element remaining in the semiconductor film 706 of Embodiment 8 which has a crystal structure will be described with reference to FIGS. 17A to 17C. A silicon oxide film is formed as a mask on the semiconductor film 706 having a crystal structure to have a thickness of 150 nm. After a resist mask 712 is formed, the silicon oxide film is etched to obtain a mask insulating film 711. Then, a noble gas element alone, a noble gas element plus phosphorus, or phosphorus alone is injected to the semiconductor film 706 having a crystal structure by ion doping to form a gettering site 713.

Figure 17B:
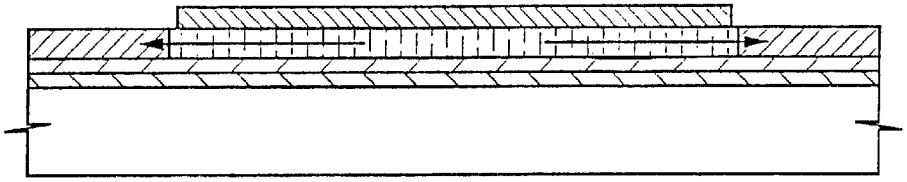
Figure 17C:
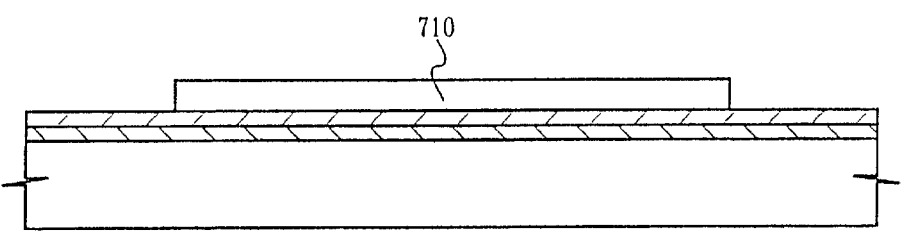

Thereafter, heat treatment is conducted in a nitrogen atmosphere at 450 to 600° C. for 0.5 to 12 hours by furnace annealing as shown in FIG. 17B. Through this heat treatment, the catalytic element remaining in the semiconductor film 706 having a crystal structure is moved to the gettering site 713 and is gathered in there.

The mask insulating film 711 and the gettering site are then removed by etching to obtain the semiconductor film 710 having a crystal structure. The semiconductor film 710 formed in accordance with this embodiment to have a crystal structure can be applied to the semiconductor film of Embodiment 1 or 2.

Embodiment 8

Figure 29:
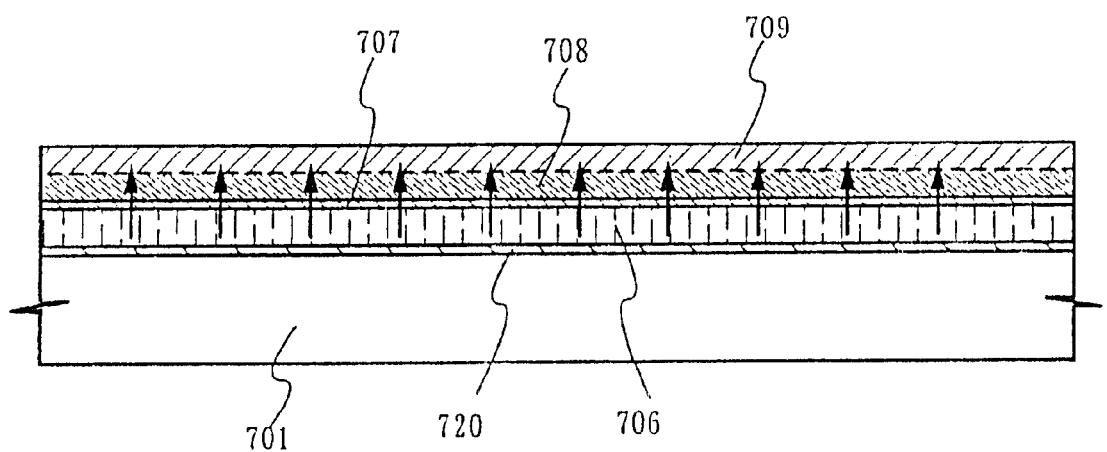
FIG. 29 is a diagram illustrating a process of manufacturing a semiconductor film that has a crystal structure.

A silicon nitride film with a thickness of 1 to 10 nm may be used as the first insulating film formed on the substrate 701 in Embodiment 6. The film is referred to as first insulating film 720. In FIG. 29, the first insulating film 720 is used and a semiconductor film 706 having a crystal structure, a barrier layer 707, a semiconductor film 708, and a semiconductor film 709 doped with a noble gas element, which are formed in accordance with Embodiment 6, are layered to receive heat treatment for gettering. A catalytic element such as nickel is by nature trapped by oxygen or in the vicinity of oxygen. Accordingly, using a silicon nitride film for the first insulating film facilitates moving of the catalytic element from the semiconductor film 706 having a crystal structure to the semiconductor film 708 or to the semiconductor film 709 doped with a noble gas element.

Embodiment 9

As liquid crystal television sets become popular and the screen size thereof becomes larger, the problem of wiring line delay in data lines and gate lines cannot be ignored any longer. For example, the pixel structure shown in Embodiment 1 is on one hand capable of providing a higher aperture ratio but, on the other hand, needs to deal with the problem of wiring line delay when the screen size is increased since the same material is used to form a data line and a gate electrode.

When a display device has a pixel density of VGA level, there are 480 gate wiring lines and 640 source wiring lines and, in the case of XGA level, 768 gate wiring lines and 1024 source wiring lines. As to the screen size of the display region, a 13 inch display measures 340 mm in diagonal length whereas it is 460 mm for a 18 inch display. This embodiment presents a method of solving the delay problem and reducing the area required for wiring to the minimum in those display devices.

A gate electrode of a TFT in this embodiment is formed from a laminate of at least two types of conductive films as in Embodiment Mode 1 or Embodiment 1. Al and Cu are preferable as low resistive materials and also have high conductivity. However, Al and Cu are weak against heat and corrosion, which have to be overcome somehow.

Specifically, the countermeasures include using a metal nitride material such as tantalum nitride and titanium nitride, or a high melting point material such as Mo and W, for a first conductive film that is in contact with a gate insulating film, and employing a material that can serve as a barrier for blocking diffusion of Al and Cu. A second conductive film is formed from Al or Cu and a third conductive film is formed thereon using Ti or W. This is for lowering the contact resistance with a wiring line to be formed on the conductive film, and for protecting Al or Cu which is oxidized relatively easily.

Figure 18:
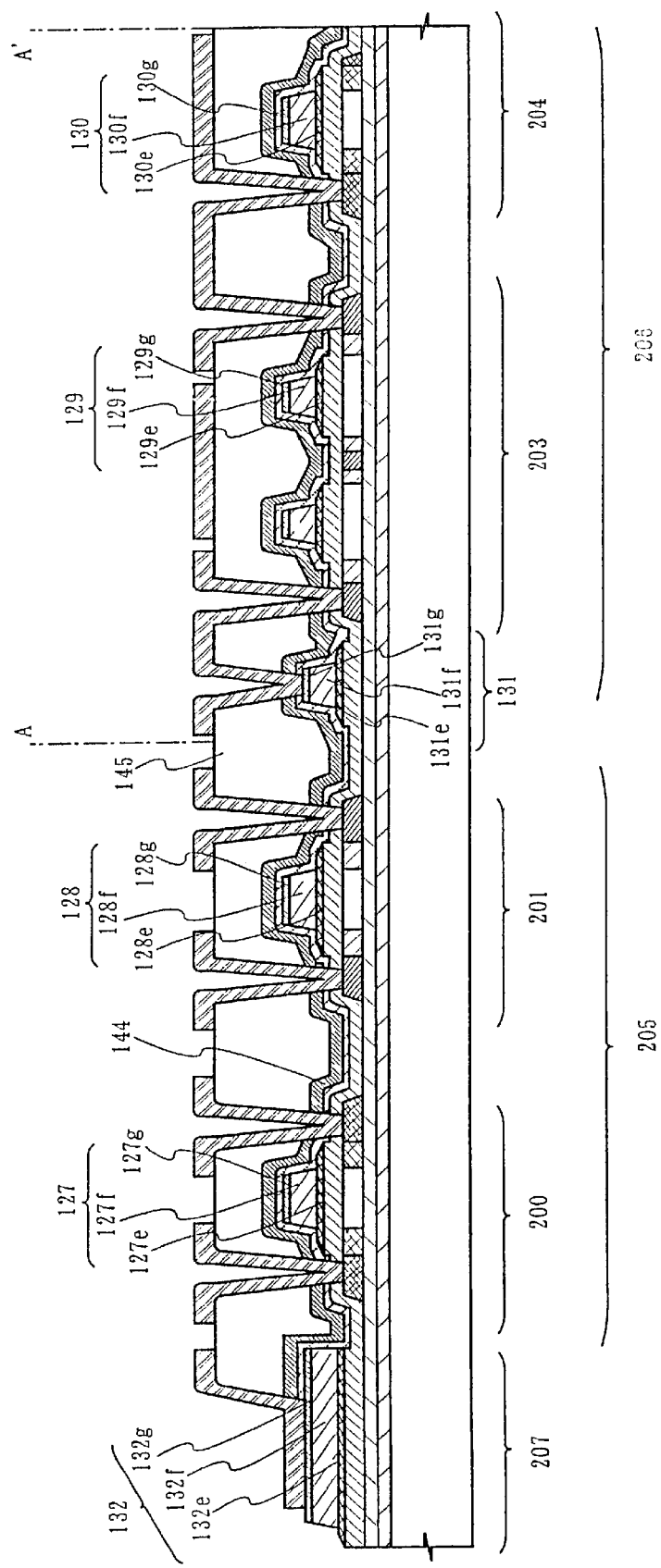
FIG. 18 is a sectional view illustrating the structure of an active matrix substrate of the present invention.

FIG. 18 shows an example in which a W film is used as the first conductive film, a Al film is used for the second conductive film, and a Ti film is used for the third conductive film to form a gate electrode, a data line, and a capacitance line. A driving circuit portion 205 and a pixel portion 206 are structured in accordance with Embodiment 1.

In first etching treatment, if an ICP etching apparatus is employed, $BCl_3$, $Cl_2$, and $O_2$ are used as etching gas, the flow rate thereof is set to 65:10:5, and the pressure is set to 1.2 Pa. A high frequency power is applied to the substrate side so that it is substantially biased negative. Under these conditions, the Al film is etched and then the etching gas is changed to $CF_4$, $Cl_2$, and $O_2$ (the flow rate is set to 25:25:10) to etch the W film.

In second etching treatment, $BCl_3$, and $Cl_2$ are used as etching gas, the flow rate thereof is set to 20:60, and a high frequency power is applied to the substrate side so that it is substantially biased negative. As a result, the Al film and the Ti film are selectively etched to form second shape electrodes 127 to 129 and second shape wiring lines 130 to 132 shown in FIG. 18 (the electrodes and wiring lines are formed from combinations of first conductive films 127e to 132e, second conductive films 127f to 132f, and third conductive films 127g to 132g).

In FIG. 18, the wiring line resistance is sufficiently lowered by forming a data line 131 and a gate line from Al. Accordingly, the substrate can be applied to a display device with 4 inch or larger pixel portion (screen size). On the other hand, Cu is suitable for the wiring lines if it is desired to raise the current density of a wiring line such as the power supply line of the light emitting device shown in Embodiment 5. A Cu wiring line is characterized by having higher resistance against electromigration than an Al wiring line.

Embodiment 10

The first n-channel TFT shown in Embodiment 1 or 2 can be an enhancement type TFT or a depression type TFT by doping the semiconductor film that serves as a channel formation region with an element belonging to Group 15 in the periodic table (preferably phosphorus) or with a Group 13 element (preferably boron). When n-channel TFTs are combined to constitute an NMOS circuit, a combination of two enhancement type TFTs makes an EEMOS circuit whereas a combination of an enhancement type TFT and a depression type TFT makes an EDMOS circuit.

An example of the EEMOS circuit is shown in FIG. 19A and an example of the EDMOS circuit is shown in FIG. 19B. In FIG. 19A, 31 and 32 both denote enhancement type n-channel TFTs (hereinafter referred to as E NTFT). In FIG. 19B, 33 denotes a E NTFT and 34 denotes a depression type n-channel TFT (hereinafter referred to as D NTFT). In FIGS. 19A and 19B, VDH represents a power supply line to which a positive voltage is applied (positive power supply line) and VDL represents a power supply line to which a negative voltage is applied (negative power supply line). The negative power supply line may be a power supply line of ground electric potential (ground power supply line).

FIGS. 20A and 20B show an example shift register manufactured from the EEMOS circuit shown in FIG. 19A or the EDMOS circuit shown in FIG. 19B. In FIGS. 20A and 20B, 40 and 41 denote flip-flop circuits. 42 and 43 denote E NTFTs. A gate of the E NTFT 42 receives a clock signal (CL) whereas a gate of the E NTFT 43 receives a clock signal with inverted polarity ($\overline{CL}$). Denoted by 44 is an inverter circuit and, as shown in FIG. 20B, uses the EEMOS circuit shown in FIG. 19A or the EDMOS circuit shown in FIG. 19B. Accordingly, it is possible to use an n-channel TFT for every TFT in driving circuits of a liquid crystal display device.

Embodiment 11

This embodiment gives an example of the circuit structure for the display device of the active matrix driving. Described in this embodiment in particular is the case where the source side driving circuit and the gate side driving circuit are all composed of the E type NTFTs of Embodiment 10. The description will be given with reference to FIGS. 21 to 23. This embodiment uses, instead of the shift register, a decoder that is comprised of only n-channel TFTs.

Figure 24:
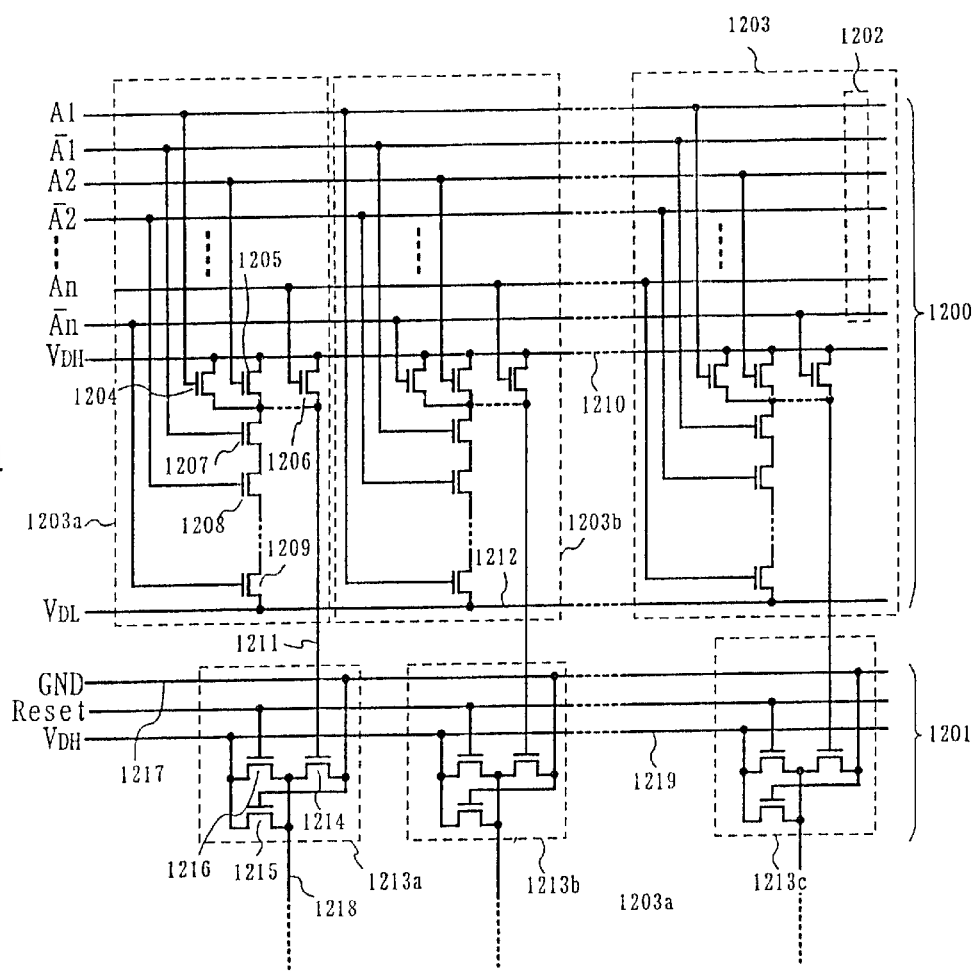
FIG. 24 is a diagram showing the structure of a gate line driving circuit that is composed of a p-channel TFT.
Figure 25:
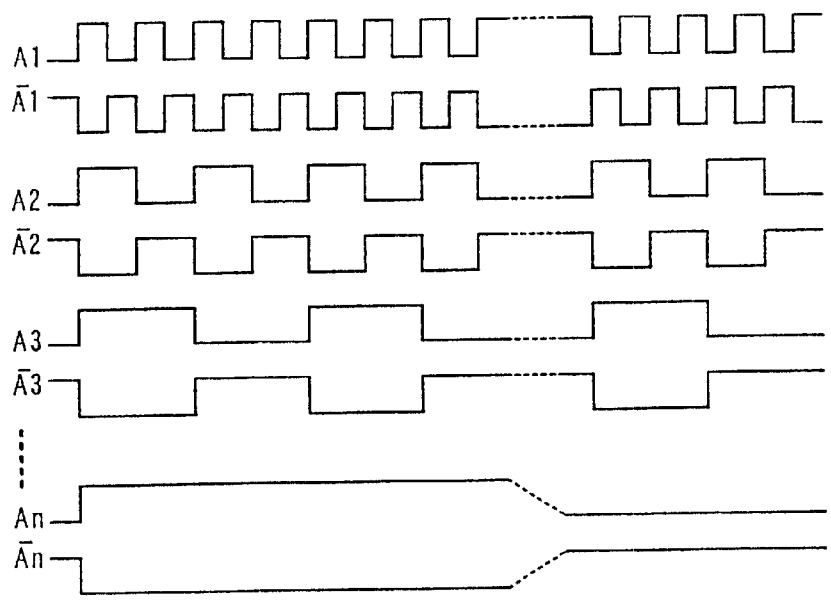
FIG. 25 is a timing chart of a decoder input signal.

FIG. 24 shows an example of the gate side driving circuit. In FIG. 25, reference symbol 1000 denotes a decoder of the gate side driving circuit and 1001 denotes a buffer unit of the gate side driving circuit. The buffer unit refers to a part where a plurality of buffers (buffer amplifiers) are integrated. A buffer is a circuit that drives without transferring the influence of the downstream to the upstream.

Figure 22:
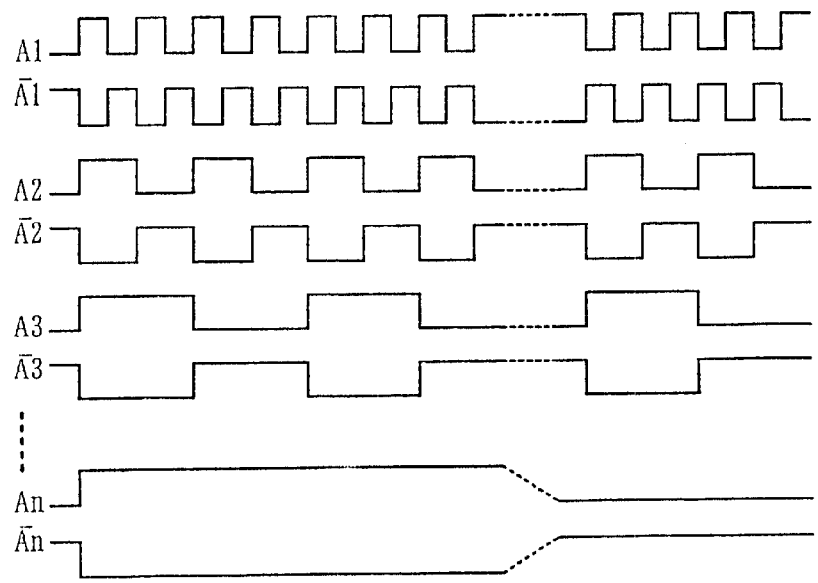
FIG. 22 is a timing chart of a decoder input signal.

First, the gate side decoder 1000 will be described. Denoted by 1002 are input signal lines (hereinafter referred to as selection lines) of the decoder 1000. Of the lines 1002, lines A1, $\overline{A1}$ (for a signal obtained by inverting the polarity of A1), A2, $\overline{A2}$ (for a signal obtained by inverting the polarity of A2), . . . , An, $\overline{An}$ (for a signal obtained by inverting the polarity of An) are shown here. In short, 2n selection lines are arranged. The number of selection lines is determined by the number of rows of gate wirings outputted from the gate side driving circuit. For instance, if the display device has a pixel portion capable of VGA level display, the number of gate wiring is 480 and hence selection lines corresponding to 9 bits (n=9), namely, 18 selection lines in total are required. The selection lines 1002 send signals shown in a timing chart of FIG. 22. As shown in FIG. 22, when the frequency of A1 is given as 1, the frequency of A2 is $2^{-1}$ times thereof, the frequency of A3 is $2^{-2}$ times thereof, and the frequency of An is $2^{-(n-1)}$ times thereof.

Reference symbol 1003a denotes a first stage NAND circuit (also called a NAND cell), 1003b denotes a second stage NAND circuit, and 1003c denotes an n-th stage NAND circuit. The number of required NAND circuits corresponds to the number of gate wirings and n NAND circuits are needed here. In short, the decoder 1000 of the present invention is comprised of a plurality of NAND circuits.

Each of the NAND circuits 1003a to 1003c has a combination of n-channel TFTs 1004 to 1009. Actually, 2n TFTs are used in each of the NAND circuits 1003. The n-channel TFTs 1004 to 1009 each have a gate that is connected to one of the selection lines 1002 (A1, A1, A2, A2, . . . An, An).

In the NAND circuit 1003a, the n-channel TFTs 1004 to 1006 each having a gate connected to one of the lines A1, A2, . . . An (these lines will be referred to as positive selection lines) are connected to one another in parallel, and connected to a negative power supply line ($V_{DL}$) 1010 as the common source and to an output line 1011 as the common drain. The n-channel TFTs 1007 to 1009 each having a gate connected to one of the lines A1, A2, . . . An (these lines will be referred to as negative selection lines) are connected to one another in series, and the n-channel TFT 1009 positioned at an end of the circuit has its source connected to a positive power supply line ($V_{DH}$) 1012 whereas the n-channel TFT 1007 positioned at the other end of the circuit has its drain connected to the output line 1011.

As described above, each NAND circuit of the present invention includes n n-channel TFTs that are connected in series and n n-channel TFTs that are connected in parallel. However, the combination of the n-channel TFTs and the selection lines is different from one circuit to the other circuit out of the n NAND circuits 1003a to 1003c. In other words, only one output line 1011 is selected at a time and the selection lines 1002 receive signals that select the output lines 1011 one by one starting from an end.

The buffer unit 1001 is composed of a plurality of buffers 1013a to 1013c in accordance with the NAND circuits 1003a to 1003c, respectively. The buffers 1013a to 1013c may all be structured in the same way.

Each of the buffers 1013a to 1013c is composed of n-channel TFTs 1014 to 1016. The output line 1011 from the decoder is inputted as a gate of the n-channel TFT 1014 (a first n-channel TFT). The n-channel TFT 1014 uses a positive power supply line ($V_{DH}$) 1017 as its source and uses as its drain a gate wiring 1018 that leads to the pixel portion. The n-channel TFT 1015 (a second n-channel TFT) uses the positive power supply line ($V_{DH}$) 1017 as its gate, a negative power supply line ($V_{DL}$) 1019 as its source, and the gate wiring 1018 kept always turned ON state as its drain.

In other words, each of the buffers 1013a to 1013c of the present invention has the first n-channel TFT (the n-channel TFT 1014) and the second n-channel TFT (the n-channel TFT 1015) that is connected in series to the first n-channel TFT and uses as its gate the drain of the first n-channel TFT.

The n-channel TFT 1016 (a third n-channel TFT) uses a reset signal line (Reset) as its gate, the negative power supply line ($V_{DL}$) 1019 as its source, and the gate wiring 1018 as its drain. The negative power line ($V_{DL}$) 1019 may be a ground power supply line (GND).

The channel width of the n-channel TFT 1015 (W1) and the channel width of the n-channel TFT 1014 (W2) satisfy the relation W1<W2. The channel width refers to the length of a channel formation region in the direction perpendicular to the channel length.

The buffer 1013a operates as follows. First, during a negative voltage is applied to the output line 1011, the n-channel TFT 1014 is in an OFF state (a state in which a channel is not established). On the other hand, the n-channel TFT 1015 is always in an ON state (a state in which a channel is established) and hence the voltage of the negative power supply line 1019 is applied to the gate wiring 1018.

When a positive voltage is applied to the output line 1011, the n-channel TFT 1014 is turned ON state. At this point, the electric potential of the gate wiring 1018 is influenced by the output on the n-channel TFT 1014 side because the channel width of the n-channel TFT 1014 is greater than the channel width of the n-channel TFT 1015. As a result, the voltage of the positive power supply line 1017 is applied to the gate wiring 1018. The gate wiring 1018 thus outputs a positive voltage (a voltage that turns the n-channel TFT used as a switching element of a pixel ON) when a positive voltage is applied to the output line 1011. On the other hand, when a negative voltage is applied to the output line 1011, the gate wiring 1018 always outputs a negative voltage (a voltage that turns the n-channel TFT used as a switching element of a pixel OFF).

The n-channel TFT 1016 is used as a reset switch for forcedly lowering the positive voltage applied to the gate wiring 1018 to the negative voltage. Specifically, the n-channel TFT 1016 inputs a reset signal when the selection period for the gate wiring 1018 is ended so that the negative voltage is applied to the gate wiring 1018. However, the n-channel TFT 1016 may be omitted.

Figure 26:
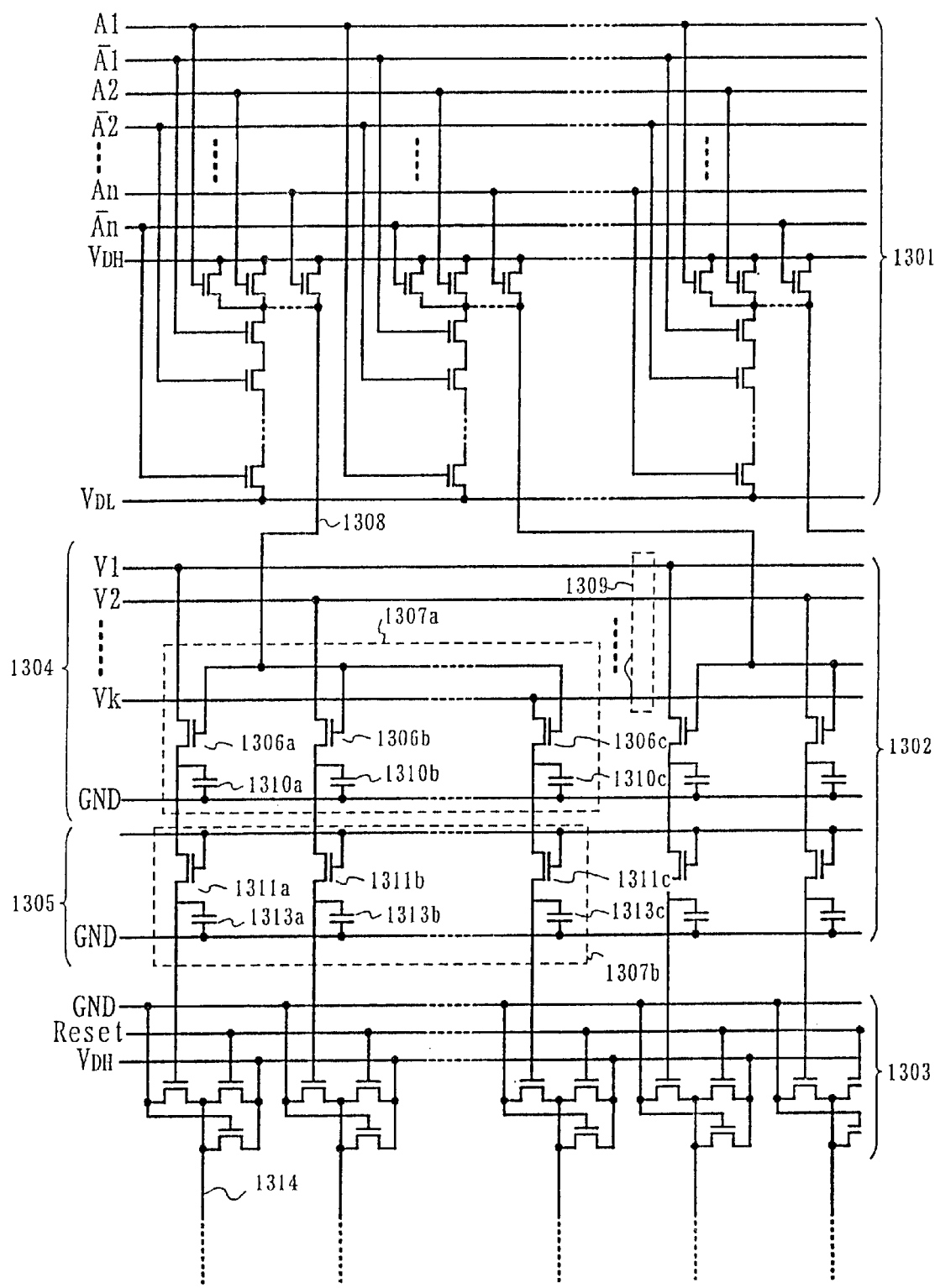
FIG. 26 is a diagram showing the structure of a data line driving circuit that is composed of a p-channel TFT.

The gate side driving circuit operating as above selects the gate wirings one by one. Next, the structure of the source side driving circuit is shown in FIG. 26. The source side driving circuit shown in FIG. 26 includes a decoder 1021, a latch 1022 and a buffer unit 1023. The structure of the decoder 1021 and the buffer unit 1023 are the same as the decoder and the buffer unit of the gate side driving circuit, and explanations thereof are omitted here.

Figure 23:
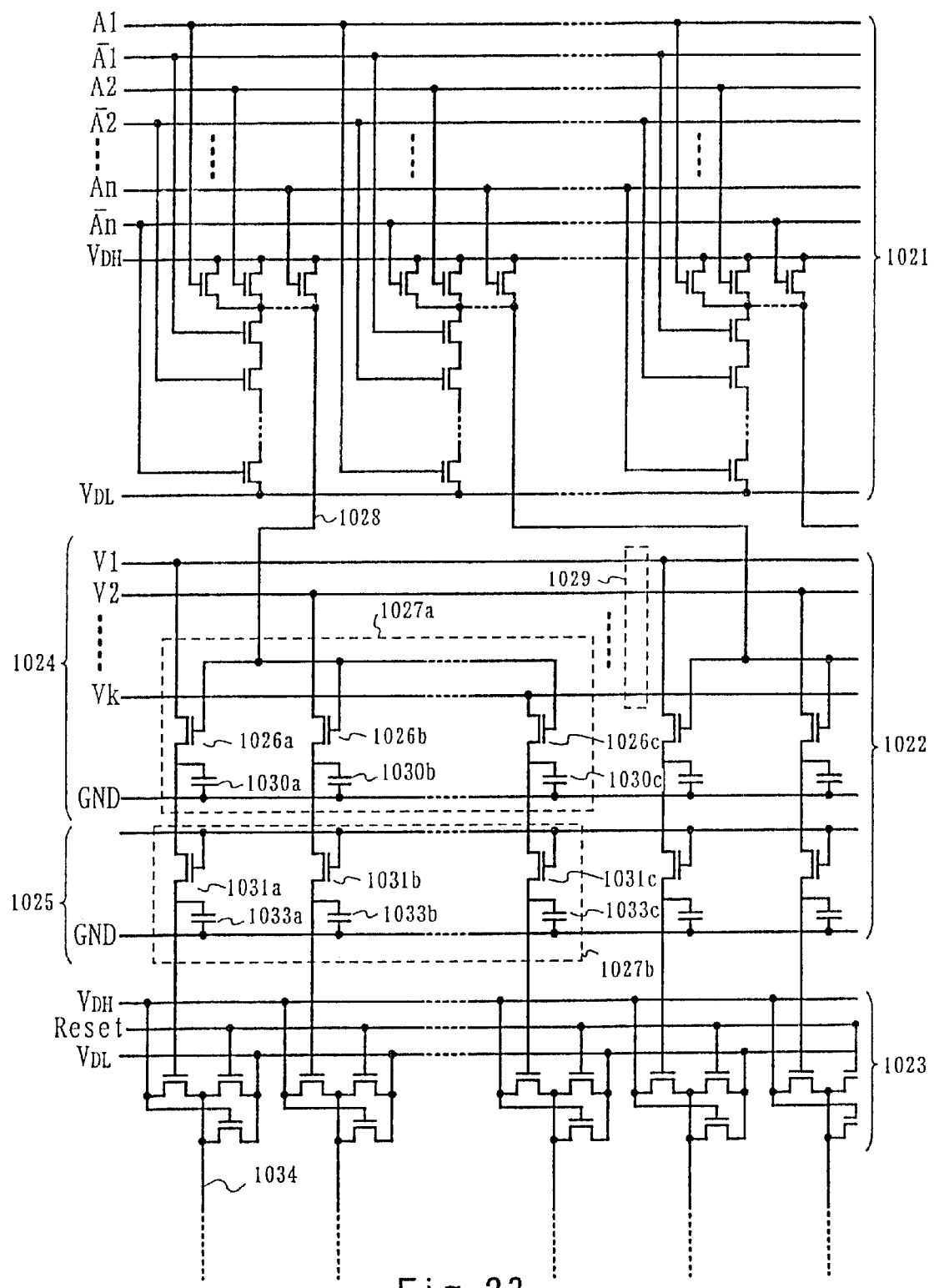
FIG. 23 is a diagram showing the structure of a data line driving circuit that is composed of an n-channel TFT.

In the case of the source side driving circuit of FIG. 23, the latch 1022 is composed of a first stage latch 1024 and a second stage latch 1025. The first stage latch 1024 and the second stage latch 1025 each have a plurality of basic units 1027 each of which is composed of m n-channel TFTs 1026a to 1026c. An output line 1028 from the decoder 1021 is inputted to gates of the m n-channel TFTs 1026a to 1026c that constitute each of the basic units 1027. The symbol m represents an arbitrary integer.

If the display device is capable of VGA level display, for instance, there are 640 source wirings. When m=1, the number of required NAND circuits is also 640 and 20 selection lines (corresponding to 10 bits) are needed. When m=8, required NAND circuits are 80 and 14 selection lines (corresponding to 7 bits) are needed. In short, the number of required NAND circuits is M/m given the number of source wirings is M.

Sources of the n-channel TFTs 1026a to 1026c are respectively connected to video signal lines (V1, V2, . . . Vk) 1029. Therefore, when a positive voltage is applied to the output line 1028, the n-channel TFTs 1026a to 1026c are turned ON at once and video signals associated with the respective TFTs are inputted. The video signals thus inputted are held in capacitors 1030a to 1030c that are connected to the n-channel TFTs 1026a to 1026c, respectively.

The second stage latch 1025 has a plurality of basic units 1027b. Each of the basic units 1027b is composed of m n-channel TFTs 1031a to 1031c. Gates of the n-channel TFTs 1031a to 1031c are all connected to a latch signal line 1032, so that the n-channel TFTs 1031a to 1031c are turned ON at once when a negative voltage is applied to the latch signal line 1032.

Figure 21:
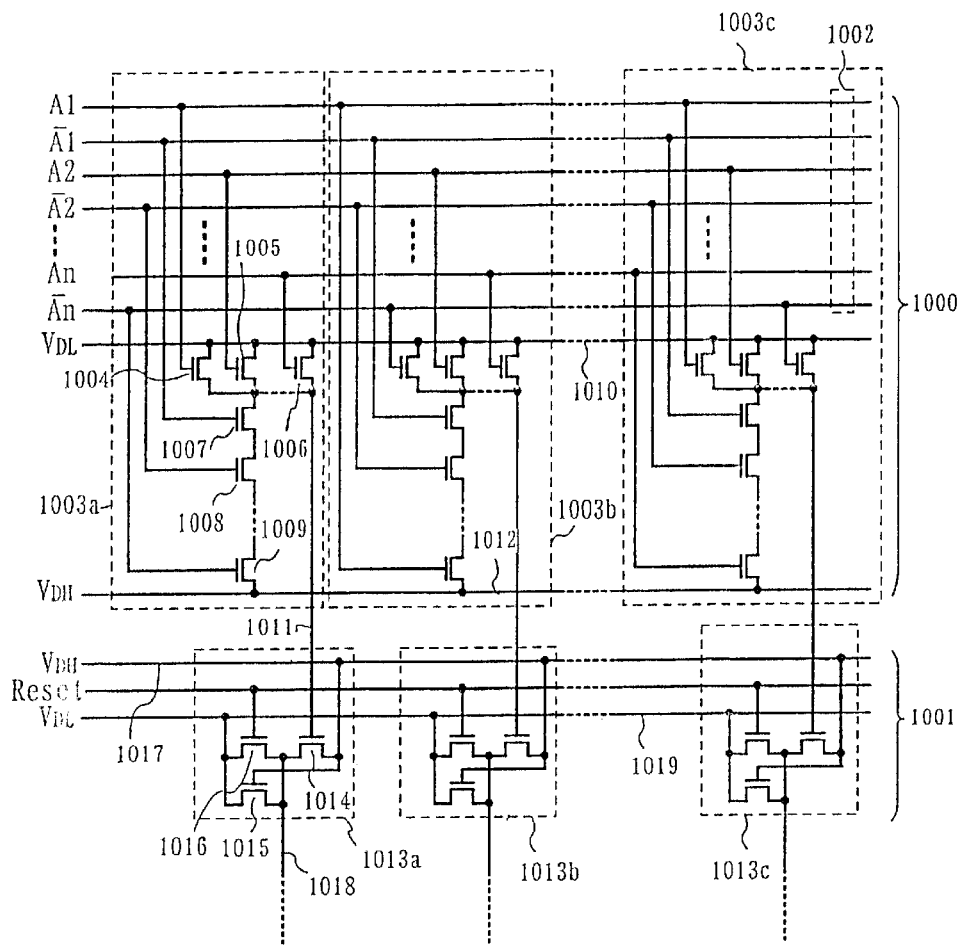
FIG. 21 is a diagram showing the structure of a gate line driving circuit that is composed of an n-channel TFT.

As a result, signals that have been held in the capacitors 1030a to 1030c are now held by capacitors 1033a to 1033c that are connected to the n-channel TFTs 1031a to 1031c, respectively. At the same time, the signals that have been held in the capacitors 1030a to 1030c are outputted to the buffer unit 1023. Then the signals are outputted through the buffers to a source wiring 1034 as illustrated in FIG. 21. The source side driving circuit operating as above selects the source wirings one by one.

As described above, a pixel portion and a driving circuit can all be composed of n-channel TFTs by making a gate side driving circuit and a source side driving circuit solely from n-channel TFT's. The structure of this embodiment can be applied to the driving circuit of an active matrix substrate in Embodiments 1 or 2.

Embodiment 12

In this embodiment, the specific example of circuit structure of display device of an active matrix driving. Especially this embodiment is such a case that p-channel TFT which is described in Embodiments 1 or 2 is used in the source side driving circuit and the gate side driving circuit. A decoder employing p-channel TFTs substituted for general shift resister. FIG. 24 illustrates an example of a gate-side driving circuit.

In FIG. 24, reference numeral 1200 denotes a decoder in the gate side driving circuit, and 1201 denotes a buffer section of the gate side driving circuit. Here, the buffer section refers to a section in which a plurality of buffers (buffer amplifiers) are integrated. Furthermore, the buffer refers to a circuit capable of exhibiting the driving capability without providing any adverse effects of a subsequent stage on a previous stage.

The gate side decoder 1200 will be now described. Reference numeral 1202 denotes input signal lines (hereinafter referred to as the selection lines) of the decoder 1200, and more specifically indicates A1, A1 (a signal having an inverted polarity with respect to A1), A2, A2 (a signal having an inverted polarity with respect to A2), ..., An, and An (a signal having an inverted polarity with respect to An). In other word, it can be considered that the 2n selection lines are arranged.

The number of the selection lines is determined based on the number of gate wirings to be output from the gate side driving circuit. For example, in the case where a pixel section for VGA display is provided, 480 gate wirings are required, which in turn requires a total of 18 selection lines to be provided for 9 bits (corresponding to the case where n=9). The selection lines 1202 transmit signals shown in the timing chart in FIG. 25. As shown in FIG. 25, assuming that a frequency of A1 is normalized to be 1, a frequency of A2 can be expressed as $2^{-1}$, a frequency of A3 can be expressed as $2^{-2}$, and a frequency of An can be expressed as $2^{-(n-1)}$.

Reference numeral 1203a denotes a first stage NAND circuit (also referred to as the NAND cell), while 1203b and 1203c denote a second stage and an n-th stage NAND circuits, respectively. The required number of the NAND circuits is equal to the number of the gate wirings, and specifically, n NAND circuits are required here. In other word, the decoder 1200 in accordance with the present invention is composed of a plurality of the NAND circuits.

In each of the NAND circuits 1203a to 1203c, p-channel TFTs 1204 to 1209 are combined to form a NAND circuit. Actually, 2n TFTs are employed in each of the NAND circuits 1203. Furthermore, a gate of each of the p-channel TFTs 1204 to 1209 is connected to either one of the selection lines 1202 (A1, A1, A2, A2, ..., An, An).

In this case, in the NAND circuit 1203a, the p-channel TFTs 1204 to 1206 that respectively have the gates connected to any of A1, A2, ..., An (which are referred to as the positive selection lines) are connected to each other in parallel, and further connected to a positive power source wiring ($V_{DH}$) 1210 as a common source, as well as to an output line 1211 as a common drain. On the other hand, the remaining p-channel TFTs 1207 to 1209 that respectively have the gates connected to any of A1, A2, ..., An (which are referred to as the negative selection lines) are connected to each other in series, and a source of the p-channel TFT 1209 positioned at one end of the circuit is connected to a negative power source wiring ($V_{DL}$) 1212 while a drain of the p-channel TFT 1207 positioned at the other end of the circuit is connected to the output line 1211.

As described in the above, the NAND circuit in accordance with the present invention includes the n TFTs of one conductivity type (the p-channel TFTs in this case) connected in series and the other n TFTs of the one conductivity type (the p-channel TFTs in this case) connected in parallel. It should be noted that in the n NAND circuits 1203a to 1203c, all of combinations among the p-channel TFTs and the selection lines are different from each other. In other word, the output lines 1211 are configured so that only one of them is selected, and signals are input to the selection lines 1202 such that the output lines 1211 are sequentially selected from one side thereof.

Then, the buffer 1201 is composed of a plurality of buffers 1213a to 1213c so as to respectively correspond to the NAND circuits 1203a to 1203c. It should be noted that the buffers 1213a to 1213c may have the same structure.

Furthermore, the buffers 1213a to 1213c are formed with p-channel TFTs 1214 to 1216 as TFTs of one conductivity type. The output line 1211 from the decoder is input as a gate of the corresponding p-channel TFT 1214 (a first TFT of the one conductivity type). The p-channel TFT 1214 utilizes a ground power source wiring (GND) 1217 as its source, and a gate wiring 1218 as its drain. Moreover, the p-channel TFT 1215 (a second TFT of the one conductivity type) utilizes the ground power source line 1217 as its gate, a positive power source line ($V_{DH}$) 1219 as its source, and the gate wiring 1218 kept always ON state as its drain.

In other words, each of the buffers 1213a to 1213c in accordance with the present invention includes the first TFT of the one conductivity type (the p-channel TFT 1214), and further includes the second TFT of the one conductivity type (the p-channel TFT 1215) that is connected to the first TFT of the one conductivity type in series and utilizes the gate of the first TFT of the one conductivity type as the drain.

Furthermore, the p-channel TFT 1216 (a third TFT of the one conductivity type) employs a reset signal line (Reset) as its gate, the positive power source line 1219 as its source, and the gate wiring 1218 as its drain. It should be noted that the ground power source line 1217 may be replaced with a negative power source line (which is a power source line for providing a voltage that causes a p-channel TFT, to be used as a switching element of a pixel, to be in the ON state).

In this case, a channel width (indicated as W1) of the p-channel TFT 1215 and a channel width (indicated as W2) of the p-channel TFT 1214 satisfy the relationship of W1<W2. The channel width refers to a length of a channel formation region measured in the direction perpendicular to a channel length.

The buffer 1213a operates as follows. During a time period in which a positive voltage is being applied to the output line 1211, the p-channel TFT 1214 is in the OFF state (i.e., its channel is not formed). On the other hand, since the p-channel TFT 1215 is always in the ON state (i.e., its channel is formed), a voltage of the positive power source line 1219 is applied to the gate wiring 1218.

On the other hand, in the case where a negative voltage is applied to the output line 1211, the p-channel TFT 1214 comes into the ON state. In this case, since the channel width of the p-channel TFT 1214 is wider than that of the p-channel TFT 1215, the electrical potential of the gate wiring 1218 is pulled by an output on the side of the p-channel TFT 1214, thereby resulting in the electrical potential of the ground power source line 1217 being applied to the gate wiring 1218.

Accordingly, the gate wiring 1218 outputs a negative voltage (that causes the p-channel TFT, to be used as the switching element of the pixel, to be in the ON state) when a negative voltage is being applied onto the output line 1211, while always outputting a positive voltage (that causes the p-channel TFT, to be used as the switching element of the pixel, to be in the OFF state) when a positive voltage is being applied onto the output line 1211.

The p-channel TFT 1216 is used as a reset switch for forcing the gate wiring 1218, to which the negative voltage is being applied, to be pulled up to a positive voltage. Namely, after a selection period of the gate wiring 1218 is completed, a reset signal is input so that a positive voltage is applied to the gate wiring 1218. It should be noted that the p-channel TFT 1216 may be omitted.

With the gate side driving circuit that operates in the above-described manner, the gate wirings are sequentially selected. Then, the structure of a source side driving circuit is shown in FIG. 26. The source side driving circuit as shown in FIG. 26 includes a decoder 1301, a latch 1302, and a buffer 1303. Since the decoder 1301 and the buffer 1303 have the identical structures with those of the gate side driving circuit, respectively, descriptions therefore are omitted here.

In the case of the source-side driving circuit shown in FIG. 25, the latch 1302 is composed of a first stage latch 1304 and a second stage latch 1305. Each of the first stage latch 1304 and the second stage latch 1305 includes a plurality of basic units 1307 each composed of m p-channel TFTs 1306*a* to 1306*c*. An output line 1308 from the decoder 1301 is input to gates of the respective m p-channel TFTs 1306*a* to 1306*c* that form the basic unit 1307. It should be noted that the number m is any integer.

For example, in the case of the VGA display, the number of the source wirings is 640. In the case where m=1, the number of the NAND circuits required to be provided is also 640, while 20 selection lines (corresponding to 10 bits) are required to be provided. On the other hand, however, when m=8, the number of the necessary NAND circuits is 80 and the number of the necessary selection lines is 14 (corresponding to 7 bits). Namely, assuming that the number of the source wirings is M, the number of necessary NAND circuits can be expressed as M/m.

Sources of the p-channel TFTs 1306*a* to 1306*c* are connected to video signal lines (V1, V2, . . . , Vk) 1309, respectively. Namely, when a negative voltage is applied to an output line 1308, all of the p-channel TFTs 1306*a* to 1306*c* are simultaneously put into the ON state, so that video signals are taken into the corresponding p-channel TFTs 1306*a* to 1306*c*, respectively. The video signals thus taken in are retained in capacitors 1310*a* to 1310*c*, respectively, connected thereto.

Furthermore, the second stage latch 1305 also includes a plurality of basic units 1307*b* each composed of m p-channel TFTs 1311*a* to 1311*c*. All of gates of the p-channel TFTs 1311*a* to 1311*c* are connected to a latch signal line 1312, so that when a negative voltage is applied to the latch signal line 1312, all of the p-channel TFTs 1311*a* to 1311*c* are simultaneously turned on.

As a result, the signals retained in the capacitors 1310*a* to 1310*c* are then retained respectively in capacitors 1313*a* to 1313*c* connected to the p-channel TFTs 1311*a* to 1311*c*, and simultaneously output to the buffer 1303. Then, as described with reference to FIG. 24, those signals are output to the source wirings 1314 via the buffer. With the source side driving circuit that operates in the above-described manner, the source wirings are sequentially selected.

As described in the above, by composing the gate side driving circuit and the source side driving circuit only of the p-channel TFTs, all of the pixel sections and the driving circuits can be entirely formed of the p-channel TFTs. Accordingly, upon fabrication of an active matrix type display device, a fabrication yield and a throughput of the TFT steps can be significantly improved, thereby resulting in a reduced fabrication cost. The structure of this embodiment can be applied to the driving circuit of an active matrix substrate in Embodiments 1 or 2.

Embodiment 13

Various semiconductor devices can be manufactured by using the present invention. The following can be given as examples of such electronic apparatuses: a video camera; a digital camera; a goggle type display (head mounted display); a car navigation system; an audio reproducing device (such as a car audio system, an audio compo system); a laptop personal computer, a game equipment; a portable information terminal (such as a mobile computer, a mobile telephone, a mobile game equipment or an electronic book); and an image playback device provided with a recording medium. Examples of these semiconductor devices are shown in FIGS. 27 and 28.

Figure 27A:
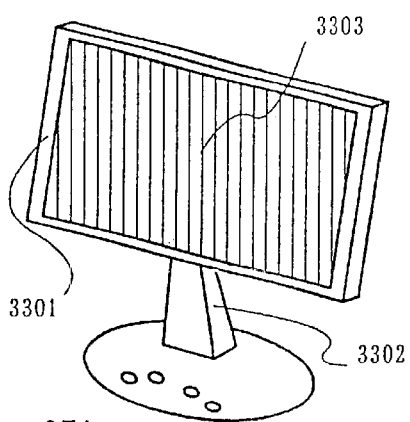
FIGS. 27A to 27F are diagrams showing examples of a semiconductor device.

FIG. 27A illustrates a monitor of a desktop personal computer and so forth, which includes a frame 3301, a support table 3302, a display portion 3303, or the like. The display portion 3303 can be applied to the liquid crystal display device of an active matrix driving shown in FIG. 8 or the light emitting device shown in FIG. 9. Another integrated circuit can be formed by applying the TFT of the present invention. The monitor of a desktop personal computer can be completed by using the present invention.

Figure 27B:
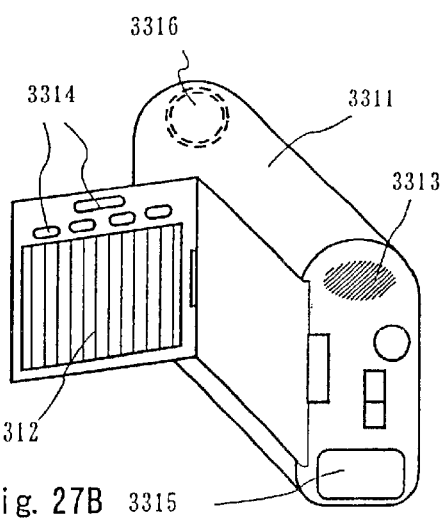

FIG. 27B illustrates a video camera which includes a main body 3311, a display portion 3312, an audio input portion 3313, operation switches 3314, a battery 3315, an image receiving portion 3316, or the like. The display portion 3312 can be applied to the liquid crystal display device of an active matrix driving shown in FIG. 8 or the light emitting device shown in FIG. 9. Another integrated circuit can be formed by applying the TFT of the present invention. The video camera can be completed by using the present invention.

Figure 27C:
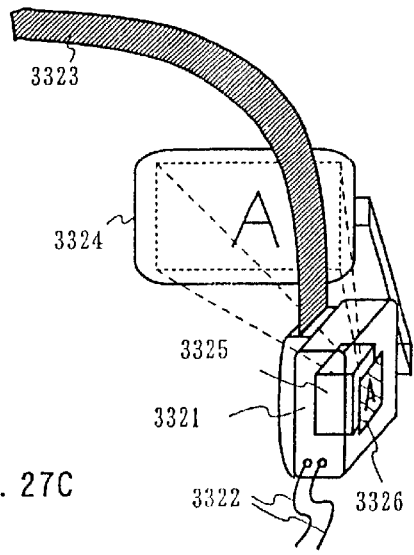

FIG. 27C illustrates a portion (the right-half piece) of a head-mounted display which includes a main body 3321, signal cables 3322, a head mount band 3323, a screen portion 3324, an optical system 3325, a display 3326, or the like. The display portion 3326 can be applied to the liquid crystal display device of an active matrix driving shown in FIG. 8 or the light emitting device shown in FIG. 9. Another integrated circuit can be formed by applying the TFT of the present invention. The head-mounted display can be completed by using the present invention.

Figure 27D:
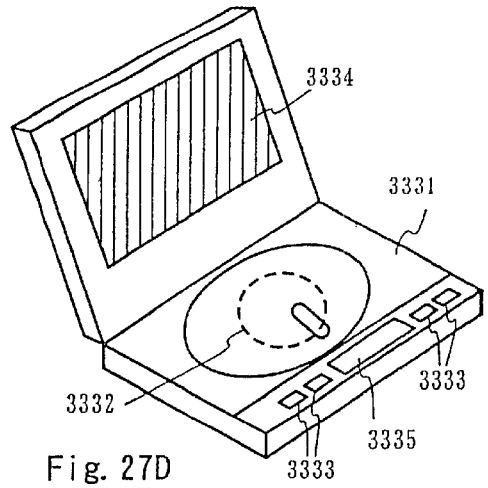

FIG. 27D illustrates an image reproduction apparatus which includes a recording medium (more specifically, a DVD reproduction apparatus), which includes a main body 3331, a recording medium (a DVD or the like) 3332, operation switches 3333, a display portion (a) 3334, another display portion (b) 3335, or the like. The display portion (a) 3334 is used mainly for displaying image information, while the display portion (b) 3335 is used mainly for displaying character information. The display portions 3334 and 3335 can be applied to the liquid crystal display device of an active matrix driving shown in FIG. 8 or the light emitting device shown in FIG. 9. Another integrated circuit can be formed by applying the TFT of the present invention. The image reproduction apparatus can be completed by using the present invention.

Figure 27E:
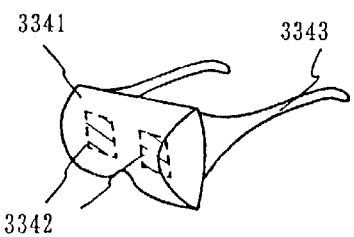

FIG. 27E illustrates a goggle type display (head-mounted display) which includes a main body 3341, a display portion 3342, an arm portion 3343 The display portion 3342 can be applied to the liquid crystal display device of an active matrix driving shown in FIG. 8 or the light emitting device shown in FIG. 9. Another integrated circuit can be formed by applying the TFT of the present invention. The goggle type display can be completed by using the present invention.

Figure 27F:
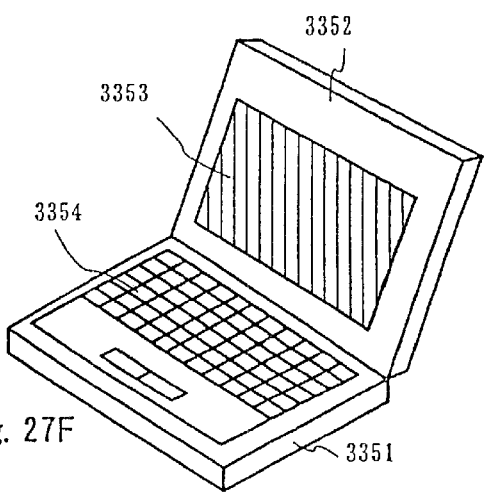

FIG. 27F illustrates a laptop personal computer which includes a main body 3351, a frame 3352, a display portion 3353, a key board 3354, or the like. The display portion 3353 can be applied to the liquid crystal display device of an active matrix driving shown in FIG. 8 or the light emitting device shown in FIG. 9. Another integrated circuit can be formed by applying the TFT of the present invention. The laptop personal computer can be completed by using the present invention.

Figure 28A:
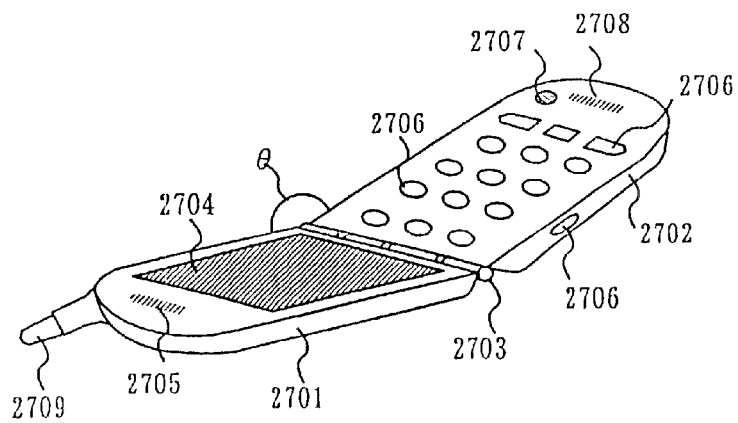
FIGS. 28A to 28C are diagrams showing examples of a semiconductor device.

FIG. 28A illustrates a portable telephone which includes a display panel 2701, an operation panel 2702, a connecting portion 2703. The display panel 2701 is composed of a liquid crystal display device, a display device 2704 typified by an EL display device, a sound output portion 2705 and an antenna 2709. The operation panel 2702 is composed of an operation key 2706, a power switch 2702 and a sound input portion 2708. The display portion 2704 can be applied to the liquid crystal display device of an active matrix driving shown in FIG. 8 or the light emitting device shown in FIG. 9. Another integrated circuit can be formed by applying the TFT of the present invention. The portable telephone can be completed by using the present invention.

Figure 28B:
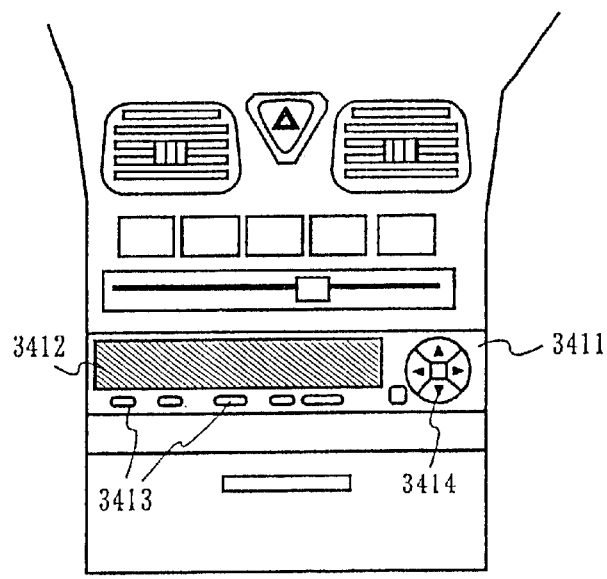

Further, FIG. 28B illustrates a sound reproduction device, specifically, a car audio equipment, which includes a main body 3411, a display portion 3412, and operation switches 3413 and 3414. The display portion 3412 can be applied to the liquid crystal display device of an active matrix driving shown in FIG. 8 or the light emitting device shown in FIG. 9. Another integrated circuit can be formed by applying the TFT of the present invention. The sound reproduction device can be completed by using the present invention.

Figure 28C:
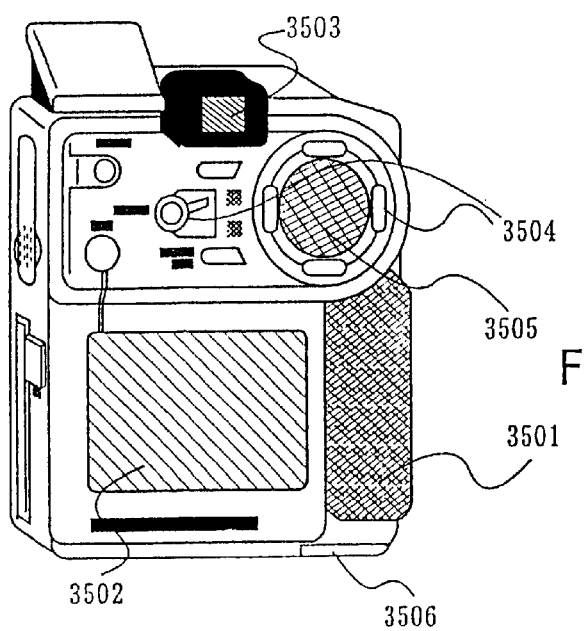

FIG. 28C illustrates a digital camera which includes a main body 3501, a display portion (A) 3502, a view finder portion 3503, operation switches 3504, a display portion (B) 3505, and a battery 3506. The display portions 3502 and 3505 can be applied to the liquid crystal display device of an active matrix driving shown in FIG. 8 or the light emitting device shown in FIG. 9. Another integrated circuit can be formed by applying the TFT of the present invention. The digital camera can be completed by using the present invention.

As set forth above, the present invention can be applied variously to a wide range of electronic apparatuses in all fields. The electronic apparatuses in this embodiment may use any one of configurations shown in Embodiments 1 to 12. As described above, the present invention is capable of forming n-channel TFTs of different LDD structures and a p-channel TFT on the same substrate by the same process. The obtained active matrix substrate can be used to manufacture a liquid crystal display device, or a display device having a light emitting layer on the same substrate.

Reducing the number of photo masks leads to improved productivity. In addition, the present invention can simultaneously improve the reliability and performance characteristics of the active matrix substrate by optimizing LDD structures of n-channel TFTs as described above.

What is claimed is:

1. A method of manufacturing a semiconductor device comprising the steps of:

forming on a first insulating film a first semiconductor film, a second semiconductor film, and a third semiconductor film that are separated from one another;

forming a second insulating film on the first semiconductor film, the second semiconductor film, and the third semiconductor film;

forming a first shape first electrode adjacent to the first semiconductor film, a first shape second electrode adjacent to the second semiconductor film, and a first shape third electrode adjacent to the third semiconductor film;

forming through first doping treatment first concentration impurity regions of one conductivity in the first semiconductor film, the second semiconductor film, and the third semiconductor film by using the first shape first electrode, the first shape second electrode, and the first shape third electrode as masks;

forming a second shape first electrode, a second shape second electrode, and a second shape third electrode from the first shape first electrode, the first shape second electrode, and the first shape third electrode;

forming through second doping treatment a second concentration impurity region of the one conductivity type in the second semiconductor film, and third concentration impurity regions of the one conductivity type in the first semiconductor film and the second semiconductor film, the second concentration impurity region overlapping the second shape second electrode; and forming through third doping treatment a fourth concentration impurity region and a fifth concentration impurity region in the third semiconductor film, the regions having another conductivity type that is opposite to the one conductivity type.

2. A method for manufacturing a semiconductor device according to claim 1, wherein said semiconductor device is incorporated into an electronic apparatus selected from the group consisting of a video camera, a digital camera, a goggle type display, a car navigation system, an audio reproducing device, a laptop personal computer, a game equipment, a portable information terminal and an image playback device.

3. A method of manufacturing a semiconductor device comprising the steps of:

forming a first semiconductor film, a second semiconductor film, and a third semiconductor film on a first insulating film;

forming a second insulating film on the first, second and third semiconductor films;

forming a first conductive film on the second insulating film;

forming a second conductive film on said first conductive film;

etching through first etching treatment the first conductive film and the second conductive film to form a first shape first electrode adjacent to the first semiconductor film, a first shape second electrode adjacent to the second semiconductor film, and a first shape third electrode adjacent to the third semiconductor film;

forming through first doping treatment first concentration impurity regions of one conductivity type in the first semiconductor film, the second semiconductor film, and the third semiconductor film;

etching through second etching treatment the first shape first electrode, second electrode, and third electrode to form a second shape first electrode, a second shape second electrode, and a second shape third electrode;

forming through second doping treatment a second concentration impurity region of the one conductivity type in the second semiconductor film, and third concentration impurity regions of the one conductivity type in the first semiconductor film and the second semiconductor film; and forming through third doping treatment a fourth concentration impurity region and a fifth concentration impurity region in the third semiconductor film, the regions having another conductivity type that is opposite to the one conductivity type.

4. A method of manufacturing a semiconductor device according to claim 3, wherein the first conductive film is formed from a compound of nitrogen and one or more elements selected from the group consisting of Ta, W, Ti, and Mo, and wherein the second conductive film is formed from an alloy that contains one or more elements selected from the group consisting of Ta, W, Ti, and Mo.

5. A method of manufacturing a semiconductor device according to claim 3, wherein the second conductive film is a film mainly containing silicon.

6. A method of manufacturing a semiconductor device according to claim 3 wherein the second conductive film is a film mainly containing aluminum or copper.

7. A method for manufacturing a semiconductor device according to claim 3, wherein said semiconductor device is incorporated into an electronic apparatus selected from the group consisting of a video camera, a digital camera, a goggle type display, a car navigation system, an audio reproducing device, a laptop personal computer, a game equipment, a portable information terminal and an image playback device.

8. A method of manufacturing a semiconductor device, comprising the steps of:

forming on a first insulating film a first semiconductor film, a second semiconductor film, and a third semiconductor film that are separated from one another;

forming a first shape first electrode over the first semiconductor film with a second insulating film interposed therebetween;

forming a first concentration impurity region of one conductivity type in the first semiconductor film by using the first shape first electrode as a mask;

forming a first shape second electrode and a first shape third electrode over the second semiconductor film and the third semiconductor film with the second insulating film interposed therebetween;

etching the first shape second electrode and the first shape third electrode to form a second shape second electrode and a second shape third electrode, respectively;

forming through second doping treatment a second concentration impurity region of the one conductivity type in the second semiconductor film, and third concentration impurity regions of the one conductivity type in the first semiconductor film and the second semiconductor film, the second concentration impurity region overlapping the second shape second electrode; and forming through third doping treatment a fourth concentration impurity region and a fifth concentration impurity region in the third semiconductor film, the regions having another conductivity type that is opposite to the one conductivity type.

9. A method of manufacturing a semiconductor device according to claim 8, wherein the first conductive film is formed from a compound of nitrogen and one or more elements selected from the group consisting of Ta, W, Ti, and Mo, and wherein the second conductive film is formed from an alloy that contains one or more elements selected from the group consisting of Ta, W, Ti, and Mo.

10. A method of manufacturing a semiconductor device according to claim 8, wherein the second conductive film is a film mainly containing silicon.

11. A method of manufacturing a semiconductor device according to claim 8 wherein the second conductive film is a film mainly containing aluminum or copper.

12. A method for manufacturing a semiconductor device according to claim 8, wherein said semiconductor device is incorporated into an electronic apparatus selected from the group consisting of a video camera, a digital camera, a goggle type display, a car navigation system, an audio reproducing device, a laptop personal computer, a game equipment, a portable information terminal and an image playback device.

13. A method of manufacturing a semiconductor device, comprising the steps of:

forming a first semiconductor film, a second semiconductor film, and a third semiconductor film on a first insulating film;

forming a second insulating film on the first semiconductor film, the second semiconductor film, and the third semiconductor film;

forming a first conductive film on the second insulating film;

forming a second conductive film on the first conductive film;

etching through first etching treatment the first conductive film and the second conductive film to form a first shape first electrode adjacent to the first semiconductor film;

forming through first doping treatment a first concentration impurity region of one conductivity type in the first semiconductor film by using the first shape first electrode as a mask;

etching through second etching treatment the first conductive film and the second conductive film to form a first shape second electrode and a first shape third electrode over the second semiconductor film and the third semiconductor film;

etching through third etching treatment the first shape second electrode and the first shape third electrode to form a second shape second electrode and a second shape third electrode;

forming through second doping treatment a second concentration impurity region of the one conductivity type in the second semiconductor film, and third concentration impurity regions of the one conductivity type in the first semiconductor film and the second semiconductor film; and forming through third doping treatment a fourth concentration impurity region and a fifth concentration impurity region in the third semiconductor film, the regions having another conductivity type that is opposite to the one conductivity type.

14. A method of manufacturing a semiconductor device according to claim 13, wherein the first conductive film is formed from a compound of nitrogen and one or more elements selected from the group consisting of Ta, W, Ti, and Mo, and wherein the second conductive film is formed from an alloy that contains one or more elements selected from the group consisting of Ta, W, Ti, and Mo.

15. A method of manufacturing a semiconductor device according to claim 13, wherein the second conductive film is a film mainly containing silicon.

16. A method of manufacturing a semiconductor device according to claim 13 wherein the second conductive film is a film mainly containing aluminum or copper.

17. A method for manufacturing a semiconductor device according to claim 13, wherein said semiconductor device is incorporated into an electronic apparatus selected from the group consisting of a video camera, a digital camera, a goggle type display, a car navigation system, an audio reproducing device, a laptop personal computer, a game equipment, a portable information terminal and an image playback device.

* * * * *